(12) United States Patent
Nordquist et al.

(10) Patent No.: US 10,141,495 B1
(45) Date of Patent: Nov. 27, 2018

(54) MICROSYSTEMS-BASED METHOD AND APPARATUS FOR PASSIVE DETECTION AND PROCESSING OF RADIO-FREQUENCY SIGNALS

(71) Applicant: National Technology & Engineering Solutions of Sandia, LLC, Albuquerque, NM (US)

(72) Inventors: Christopher Nordquist, Albuquerque, NM (US); Benjamin Griffin, Albuquerque, NM (US); Christopher Dyck, Albuquerque, NM (US); Matt Eichenfield, Albuquerque, NM (US); Kenneth Wojciechowski, Albuquerque, NM (US); Roy H. Olsson, Arlington, VA (US); Aleem Siddiqui, Albuquerque, NM (US); Michael David Henry, Albuquerque, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 0 days.

(21) Appl. No.: 15/843,355

(22) Filed: Dec. 15, 2017

Related U.S. Application Data

(60) Provisional application No. 62/435,551, filed on Dec. 16, 2016.

(51) Int. Cl.
*H01L 41/047* (2006.01)
*H04B 1/16* (2006.01)
(Continued)

(52) U.S. Cl.
CPC ......... *H01L 41/047* (2013.01); *H04B 1/1615* (2013.01); *H01H 3/32* (2013.01); *H01L 41/08* (2013.01); *H01L 41/09* (2013.01)

(58) Field of Classification Search
CPC ..... H01L 41/042; H01L 41/047; H01L 41/08; H01L 41/09; H01H 1/00; H01H 3/00;
(Continued)

(56) References Cited

U.S. PATENT DOCUMENTS

| 6,614,853 B1 * | 9/2003 | Koslar | H04B 1/69 375/139 |
| 7,937,056 B2 * | 5/2011 | Itaya | H01G 5/18 310/311 |

(Continued)

OTHER PUBLICATIONS

Nielson, G. N., Olsson, R. H., Bogart, G. R., Resnick, P. R., Spahn, O. B., Tigges, C., Grossetete, G., Barbastathis, G., "Dynamic pull-in and switching for sub-pull-in voltage electrostatic actuation," The 14th International Conference on Solid-State Sensors, Actuators, and Microsystems (Transducers '07), vol. 1, p. 455-459, Jun. 2007.
(Continued)

*Primary Examiner* — Duc M Nguyen
(74) *Attorney, Agent, or Firm* — Martin I. Finston; Mark A. Dodd

(57) ABSTRACT

A radio frequency (RF) receiver comprises a passive impedance transforming voltage amplifier and a resonant, latching micromechanical switch having a deflectable bridge, an RF actuation electrode receivingly connected to the amplifier, and a DC bias electrode positioned to latch the switch in a closed position by electrostatic attraction when energized by a suitable voltage. The bridge is configured with a mechanical mode of vibration that periodically urges the switch toward the closed position.

23 Claims, 17 Drawing Sheets

(51) Int. Cl.
*H01H 3/32* (2006.01)
*H01L 41/09* (2006.01)
*H01L 41/08* (2006.01)

(58) Field of Classification Search
CPC ...... H01H 3/32; H04B 1/1607; H04B 1/1615; H04B 5/0037
See application file for complete search history.

(56) References Cited

U.S. PATENT DOCUMENTS

| | | | | |
|---|---|---|---|---|
| 8,260,201 | B2* | 9/2012 | Rossman | G06K 19/07749 340/10.34 |
| 9,590,284 | B1 | 3/2017 | Nordquist et al. | |
| 9,787,340 | B2* | 10/2017 | Rinaldi | H04B 1/18 |
| 2004/0214605 | A1* | 10/2004 | Zhang | H01Q 3/247 455/562.1 |
| 2005/0192727 | A1* | 9/2005 | Shostak | B60C 11/24 701/37 |
| 2005/0226312 | A1* | 10/2005 | Koslar | H04B 1/69 375/142 |
| 2009/0039798 | A1* | 2/2009 | Siessegger | H05B 41/2881 315/276 |
| 2009/0284351 | A1* | 11/2009 | Rossman | G06K 19/07749 340/10.1 |
| 2010/0308794 | A1* | 12/2010 | Townsend | G01B 7/16 324/103 P |
| 2015/0185879 | A1* | 7/2015 | Aurongzeb | G06F 3/03545 345/179 |
| 2017/0126263 | A1* | 5/2017 | Rinaldi | H04B 1/18 |

OTHER PUBLICATIONS

Nielson, G. N., Barbastathis, G., "Dynamic pull-in of parallel plate and torsional electrostatic MEMS actuators," Journal of Microelectromechanical Systems (JMEMS), vol. 15, p. 811-821, Aug. 2006.
D. A. Czaplewski, et. al, "RE MEMS Switches with RuO2—Au Contacts Cycled to 10 Billion Cycles," J. Microelectromech. Syst., v. 22, No. 3, pp. 655-661, Jun. 2013.
D. A. Czaplewski, et al., "A nanomechanical switch for integration with CMOS logic," J. Micromechanics Microengineering, vol. 19, p. 085003 (2009).
W.-C. Li, Y. Lin, and C. T.-C. Nguyen, "Metal Micromechanical Filter-Power Amplifier Utilising a Displacement-Amplifying Resonant Switch," Transducers 2013, pp. 2469-2472, Jun. 2013.
J. R. Reid, L. A. Starman, and R. T. Webster, "RF Actuation of Capacitive MEMS Switches", 2003 IEEE MTT-S Int. Microw. Symp. Dig., San Francisco, CA, USA, Jun. 2003, pp. 1919-1922.
V. Viikari and H. Seppa, "RFID MEMS Sensor Concept Based on Intermodulation Distortion," IEEE Sensors Journal, vol. 9, No. 12, pp. 1918-1923, Dec. 2009.

R. Liu, J. Naghsh Nilchi, Y. Lin, T. L Naing, C. T. C. Nguyen, "Zero Quiescent Power VLP Mechanical Communications Receiver," 2015 Intl. Conf. Solid-State Sensors, Actuators, and Microsystems, Jun. 2015, pp. 129-132.
K. Vummidi, J. Hammond, J. Costa, S. Raman, "Resonant Pull-in for a Variable Gap Lateral Contact RF MEMS Switch," Proc. 23rd Intl. Conf. MEMS, Jan. 2010, pp. 767-770.
K. Amponsah, N. Yoshimizu, S. Ardanuc, and A. Lal, "Near-kT Switching-Energy Lateral NEMS Switch," Proc. 2010 IEEE Intl Conf. Nano/Micro Eng. Molecular Syst., Xiamen, China, Jan. 20-23, 2010, pp. 985-988.
R. Lu, T. Manzaneque, M. Breen, A. Gao, and S. Gong, "Piezoelectric RF Resonant Voltage Amplifiers for IoT Applications", 2016 IEEE MTT-S Int. Microw. Symp. Dig., San Francisco, CA, USA, Jun. 2016, pp. 1-4.
S. S. Bedair, J. S. Pulskamp, R. G. Polcawich, B. Morgan, J. L. Martin, and B. Power, "Thin-Film Piezoelectric-on-Silicon Resonant Transformers", J. Microelectromech. Sys. vol. 22, No. 6, pp. 1383-1394, Dec. 2013.
M. Eichenfield and R. H. Olsson, "Design, Fabrication, and Measurement of RF IDTs for Efficient Coupling to Wavelength-Scale Structures in Thin Piezoelectric Films," Proc. 2013 IEEE Intl. Ultrasonics Symp., Prague, Czech Republic, Jul. 2013, pp. 753-756.
P. Attia and P. Hesto, "Dependence of the Resonant Frequency of Micromachined Gold Microbeams on Polarisation Voltage," Microelectronics Journal, vol. 29, pp. 543-546, 1998.
A. Fargas-Marques, et. al., Resonant Pull-In Condition in Parallel-Plate Electrostatic Actuators, J. Microelectromech. Syst, vol. 16, No. 5 pp. 1044-1053, Oct. 2007.
J. Juillard, "Analysis of resonant pull-in of micro-electromechanical oscillators," J. Sound and Vibration, No. 350 pp. 123-139, 2015.
C. W. Dyck, T. A. Plut, C. D. Nordquist, P. S. Finnegan, F. Austin, I. Reines, and C. L. Goldsmith, "Fabrication and characterization of ohmic contacting RF MEMS switches," in Proc. SPIE 5344 MEMS/MOEMS Components and Their Applications, 2004, pp. 79-88.
R. H. Olsson III, et. al, "Microresonant Impedance Transformers," Proc. 2009 Ultrasonics Symp. Sep. 2009, Rome, Italy.
C. Zuo and G. Piazza, "Single-Ended-to-Differential and Differential-to-Differential Channel-Select Filters Based on Piezoelectric Contour-Mode MEMS Resonators," Proc. 2010 IEEE Intl. Freq. Cntl. Symp., Jun. 2010, Newport Beach, CA.
C. Cassella et al., "RF Passive Components Based on Aluminum Nitride Cross-Sectional Lame'-Mode MEMS Resonators," IEEE Trans. Electr. Dev. 64 (2017) 237-243.
T. Manzaneque et al., "A High FOM Lithium Niobate Resonant Transformer for Passive Voltage Amplification," Transducers 2017, Kaohsiung, Taiwan, Jun. 18-22, 2017, IEEE, pp. 798-801.
C. D. Nordquist, et. al, "A DC to 10 GHz 6-b RF MEMS Time Delay Circuit," IEEE Microwave and Wireless Component Letters, vol. 16, No. 5, pp. 305-307, May 2006.
G.N. Nielson et al., "High-Speed, Sub-Pull-In Voltage MEMS Switching," SAND2008-0211, Sandia National Laboratories, Unlimited Release, Jan. 2008.

* cited by examiner

MICROSYSTEMS-BASED METHOD AND APPARATUS FOR PASSIVE DETECTION AND PROCESSING OF RADIO-FREQUENCY SIGNALS

CROSS-REFERENCE TO RELATED APPLICATION

This application claims priority to U.S. Provisional Patent Application No. 62/435,551 filed Dec. 16, 2016 under the title, "Microsystems-Based Method and Apparatus for Passive Detection and Processing of Radio-Frequency Signals", the entirety of which is hereby incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

This invention relates to microelectromechanical systems (MEMS), and more particularly to MEMS devices that are responsive to radio-frequency (RF) signals.

ART BACKGROUND

There are several known approaches to the problem of electronic wakeup initiated by the receipt of a radio frequency (RF) signal. However, the known approaches suffer various drawbacks. These include (depending on the particular approach) a necessary power draw of more than a microwatt to monitor for low-level signals, a need for duty cycling, a tradeoff that sacrifices sensitivity in favor of lower power dissipation, and a need for relatively high power levels to self-power the wake-up stage.

Accordingly, there remains a need for RF wakeup devices that combine high sensitivity with extremely low quiescent power dissipation.

SUMMARY OF THE INVENTION

We have developed an RF receiver that has extremely low quiescent power dissipation, but that can be woken up by an RF signal having specified waveform characteristics. This is achieved by combining a frequency-selective, resonant voltage transformer with a low-voltage, resonant, micromachined switch.

In the transformer, a low impedance (which would typically be 50 ohms) is converted to a high impedance (for example, an impedance in the vicinity of 100 kilohms) in order to achieve a passive voltage gain. The transformed RF signal is used to drive mechanical oscillations of the microswitch that are resonant at a modulation frequency of the RF signal. When sufficient mechanical energy has been stored in the oscillating switch, the switch closes and activates a wake-up circuit.

In example embodiments, the transformer comprises a piezoelectric focusing transducer, in which a Gaussian beam is used to focus acoustic energy from an input transducer with a large aperture into an output transducer with a smaller aperture, thus increasing the energy density at the output transducer. When a focusing transducer is used, the transformer impedance ratio is determined by the ratio of the areas of the input and output transducer fingers, although the output capacitance limits the maximum impedance ratio that can be achieved in practice. Because the transducer is a resonant device, it will respond to RF signals only if the carrier frequency falls within a narrow frequency range designed into the transducer. These devices do not require a power supply to operate, hence they can provide completely passive RF signal processing. Focusing transducers based on the aluminum nitride (AlN) material system have been made and tested and are reported in the literature. Alternate materials such as lithium niobate ($LiNbO_3$) can also serve as a basis for such devices.

In some embodiments, the impedance transformer uses dispersion to compress a chirped signal, thus providing additional processing gain for the RF signal. For example, RF pulses can be sequentially injected into a dispersive medium at respective carrier frequencies having progressively greater propagation velocities. Such pulses can be timed so that the later pulses overtake the earlier pulses. Accordingly, a plurality of such pulses can be made to coincide at the output end of the medium, thus providing an amplified output signal. Dispersion can be engineered through the physical layouts of the transducer fingers. A similar result can be effectuated, even without chirping, by using acoustic transmission lines having different propagation delays to correlate pulses injected at different times.

In addition to storage of signal energy, the resonant microswitch also rectifies the signal because the switch response is described by a voltage-squared switch actuation function. Consequently, the switch response rectifies the input signal by converting a bipolar RF input signal into a unipolar positive force on the switch beam. Because the carrier frequency is chosen to be higher than the resonant frequency of the switch, the beam will move according to the average force over a pulse, and not according to the RF carrier frequency.

If, in addition, the signal is subjected to on-off modulation at the mechanical resonant frequency of the switch, the switch will deflect with each of the switch signal pulses. Each pulse will add more energy to the switch, thus increasing the amplitude of the mechanical resonance, until the switch beam comes close enough to a plate charged by a DC bias to be captured by its electrostatic field. In that event, pull-in takes place; that is, the switch is pulled closed and a wake-up circuit is completed.

The DC bias, which in examples is provided by a battery or power supply, can be chosen to pull the switch near pull-in but not beyond it, absent an RF input signal. The switch is a latching switch; that is, it remains held closed by the DC bias after actuation until the DC bias is interrupted. The bias is interrupted, e.g., by a passive turn-off circuit using RC delays or through a command from the now-awakened system controller.

In this regard, it is considered advantageous to use a microswitch because of certain desirable characteristics that suitable designs can provide. These include: High subthreshold slopes that can exceed 1 decade per millivolt, low off-state currents that can be as low as 0.1 pA or even less, and low input capacitances, which can be as low as 5 fF or even less. Because of low leakage currents and high subthreshold slopes, suitable microswitches can be expected to dissipate negligible amounts of power except when the desired signal is present.

Our new approach can permit all-passive signal processing and wake-up with excellent signal discrimination and low false alarm rates. Rough estimates based on conservation of energy suggest that signal sensitivities better than −100 dBm (0.1 pW) may be achievable with optimized design of the resonant focusing transformer and resonant microswitch and with optimized circuit integration.

Accordingly, the invention in one aspect is an RF receiver comprising a resonant voltage transformer and a resonant, latching micromechanical switch. The transformer is configured to receive an RF input signal and to provide, at an output, an RF output signal having a stepped-up voltage. The switch is configured to respond with deflection of a switch beam when the switch is energized by the RF output signal from the transformer. The switch is energized by applying a suitable voltage waveform to an actuation electrode or the like so as to deflect the switch beam.

The transformer is configured to have a resonant RF frequency, i.e. an electrical resonant frequency in the radiofrequency range. The switch is configured to have a mechanical resonant frequency, i.e. a mechanical resonant frequency of the switch beam, that is less than the resonant RF frequency of the transformer.

In embodiments, the transformer comprises a piezoelectric focusing transducer.

In embodiments, the switch comprises a bridge beam that is electrostatically actuated by a bias plate configured to be energized by a bias voltage and that is conjointly electrostatically actuated by a signal plate configured to be energized by an input RF signal.

In embodiments, the transformer comprises a piezoelectric transducer and a plurality of acoustic transmission lines having different respective propagation delays.

In another aspect, the invention is a method for operating an RF detector. The method comprises exciting the RF detector with a modulated RF signal having a carrier frequency and an envelope frequency. The modulated RF signal is amplified in a resonant amplifier that is frequency-selective for the carrier signal, thereby to produce an amplified RF signal modulated with the envelope frequency. The amplified RF signal is applied to a resonant, latching micromechanical switch so as to cause deflection of a switch beam. The envelope frequency of the amplified RF signal corresponds to a mechanical resonant frequency of the switch.

In embodiments, the modulated RF signal is a pulsed signal and the envelope frequency is a pulse frequency.

In embodiments, the amplifier comprises a piezoelectric transducer that injects signal pulses into a dispersive acoustic medium, and the method further comprises chirping the carrier frequency such that different pulses have different acoustic propagation velocities within the dispersive acoustic medium.

In embodiments, the modulated RF signal is a pulse train, the amplifier comprises a piezoelectric transducer that injects signal pulses into an acoustic medium, and the method further comprises adding different acoustic propagation delays to signal pulses injected into the acoustic medium at different times so as to equalize an arrival time at a node across a plurality of signal pulses, and combining a plurality of signal pulses arriving at the node.

In embodiments, the method further comprises varying the envelope frequency to track changes in the mechanical resonant frequency of the switch.

BRIEF DESCRIPTION OF THE DRAWINGS

FIG. 3A is a top-down view based on an electron micrograph of a fabricated transducer. FIG. 3B is a perspective diagram based on a numerical simulation. The diagram includes shading to indicate the propagating acoustic wave.

In FIG. 4A, the acoustic waveguide is $0.5\lambda$ wide, wherein $\lambda$ is the acoustic wavelength. In FIG. 4B, the acoustic waveguide is $10\lambda$ wide.

DETAILED DESCRIPTION

Figure 1:
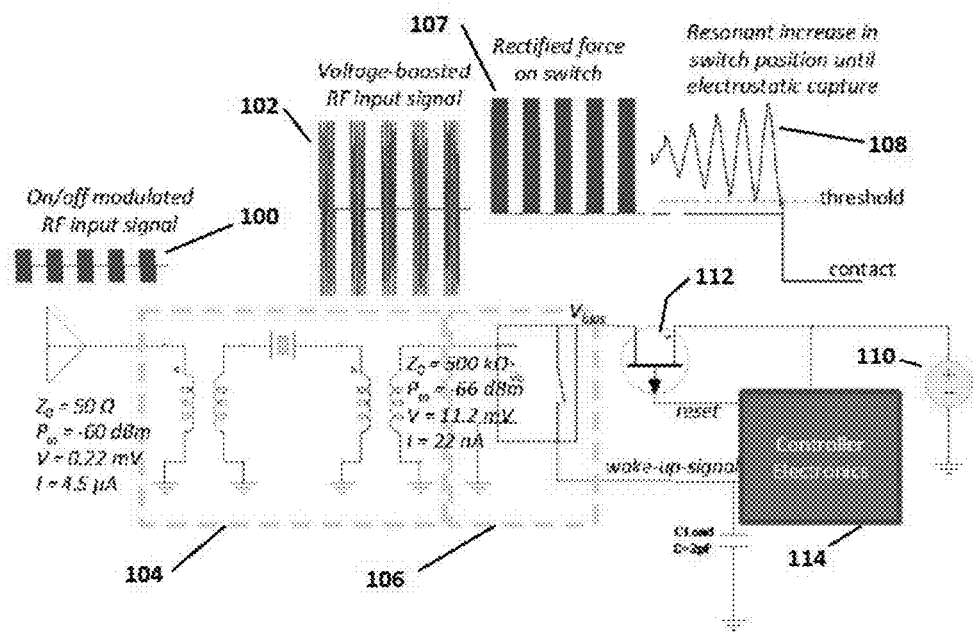
FIG. 1 is a notional diagram of an RF wake-up system according to the principles described herein.

FIG. 1 is a notional diagram of an RF wake-up system according to our new approach. In embodiments, this approach improves the sensitivity of passive RF receivers by compressing the energy of a signal 100 in frequency and/or time to produce a higher-voltage signal 102 that triggers a switch. This eliminates active gain stages and comparators from the receiver chain and replaces them with two passive signal processing elements: a dispersive impedance transformer 104 and a resonant microswitch 106. The impedance transformer 104 provides frequency selectivity, signal compression, and passive voltage gain.

The resonant microswitch 106 provides energy integration over many pulses, it provides signal rectification, and it connects a path to signal presence of the desired RF signal.

The receiver can be tuned to waveform attributes such as repetition frequency, modulation frequency, and chirp rate. The center frequency of the impedance transformer will match the RF carrier frequency ($f_{carrier}$), the dispersion properties and frequency bands of the piezoelectric network will match the modulation of the RF carrier, and the switch mechanical resonant frequency will match the pulse repetition frequency (PRF). This modulation approach provides passive signal discrimination through both $f_{carrier}$ (resonant transformer) and PRF (resonant microswitch). It is unlikely that a noise signal will present a sufficient number of pulses with both the correct $f_{carrier}$ and the correct PRF to generate false alarms.

The most basic example is an on-off-keyed (OOK) signal with an exemplary $f_{carrier}$ of about 100 MHz and an exemplary pulse repetition frequency (PRF) of about 10 kHz. The transformer 104 will pass and boost signals only of the correct center frequency. Impedance transformation provides passive higher voltage but lower current while conserving signal energy (aside from some energy loss in the transfer). The voltage gain will be limited by the impedance at the transformer output, so minimizing interstage capacitance will be important for optimal performance.

By way of a numerical example, converting from an input impedance of 50Ω to an output impedance of 500 kΩ would allow the voltage to be stepped up from, e.g., 0.22 mV (−60 dBm in 50Ω) to approximately 11 mV (−66 dBm in a 500 kΩ system after allowing for 6 dB loss). Because the high impedance signal is very sensitive to capacitance, the output impedance is limited by the parasitic capacitance of the output node. For example, a capacitance of 3 fF gives 500 kΩ at 100 MHz. Hence care should be taken to minimize the trace length and the input capacitance to the next stage. Alternatively, the response may be improved by matching the imaginary part of the impedance with high-Q passive devices, leaving the real part of the impedance.

After the signal has been voltage boosted, it passes to the input of the resonant microswitch 106, which at least for a MEMS switch can have a low capacitance because the actuation is across an air gap in the MEMS switch. The $V^2$-dependent electrostatic force ensures that RF voltage always deflects the switch towards the actuation electrode. The resulting rectified force on the switch is represented notionally as pulse train 107 in the figure.

However, the energy in a single pulse will be insufficient to actuate a practical switch, so repeated pulses must be applied at the resonant frequency of the switch to drive an oscillation of increasing amplitude, which stores energy and integrates the signal.

Once the stored energy and the corresponding amplitude of the mechanical oscillations 108 have grown large enough, the switch is captured by an electrostatic force that closes the contact to connect the power supply to wake up the node. The electrostatic force may be supplied from a battery bias 110, a separate power supply, or from charge stored in a dielectric.

In the system depicted in FIG. 1, control is provided by controller circuit 114.

Additional switching energy and higher signal selectivity can be obtained using more complex modulations such as chirping, multiple frequencies, and spread-spectrum modulation.

A chirped signal may be compressed into a shorter pulse of higher amplitude through dispersion, multiple frequencies may provide improved selectivity or lower power in a given tone, and spread-spectrum modulation may be combined with time delays for constructive combining of the received pulses at the switch input.

Figure 2:
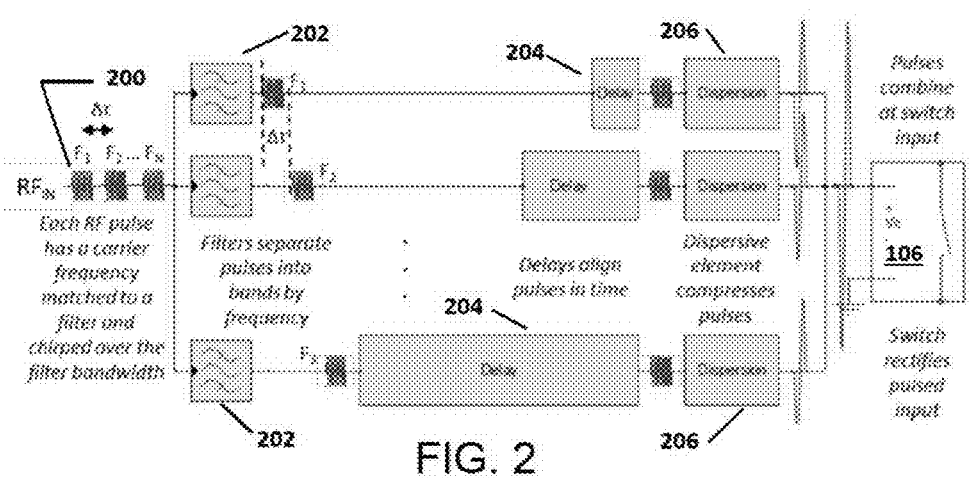
FIG. 2 provides an example of a modulation scheme using a train of chirped pulses that is useful in connection with embodiments of the present invention.

An example of a modulation scheme using a train 200 of chirped pulses with RF carrier frequencies of $F_1, F_2, \ldots, F_N$ is shown in FIG. 2. The frequency varies within each pulse, and additionally, the center frequency varies from pulse to pulse so that each pulse is matched to a different RF filter band. Accordingly, each pulse is routed into a specific path by a respective matched filter 202, stepped-up in voltage, delayed by an appropriate amount in a respective delay element 204 so that the pulses add constructively at the output, and time-compressed by a respective dispersive element 206. Lamb-wave devices in aluminum nitride (AlN) or lithium niobate ($LiNbO_3$) can perform all of these functions, with some functions performed within a single device such as a frequency-selective resonant transformer.

Dispersive Impedance Transformer

It will be advantageous for at least some applications to use, for dispersive impedance transformer 104, a device that incorporates piezoelectric focusing transducers fabricated in, e.g., aluminum nitride (AlN) or lithium niobate ($LiNbO_3$). These devices can provide frequency selectivity and voltage gain in a small volume.

Piezoelectric resonant transformers and focusing transducers have been reported previously, for example in R. H. Olsson III, et. al, "Microresonant Impedance Transformers," *Proc. 2009 Ultrasonics Symp.* September 2009, Rome, Italy ("Olsson 2009"), M. Eichenfield, et al., "Design, fabrication, and measurement of RF IDTs for efficient coupling to wavelength-scale structures in thin piezoelectric films," in Proc. IEEE Ultrasonics Symposium, 2013, pp. 753-756 ("Eichenfield 2013"), and C. Zuo and G. Piazza, "Single-Ended-to-Differential and Differential-to-Differential Channel-Select Filters Based on Piezoelectric Contour-Mode MEMS Resonators," *Proc. 2010 IEEE Intl. Freq. Cntl. Symp.*, June 2010, Newport Beach, Calif., the entirety of each of which is hereby incorporated herein by reference.

Olsson 2009 and Eichenfield 2013, for example, reported on the design and demonstration of a transducer that produced a Gaussian acoustic beam in a 750 nm thick suspended aluminum nitride membrane. In operation, a substantially uniform electric field applied between top and bottom electrodes produced a substantially uniform volumetric piezoelectric force to the suspended piezoelectric membrane. This force excited Lamb-type waves in the membrane. In the far field, the Lamb waves approximated a Gaussian beam. This was facilitated by a fan-like array of curved finger electrodes. The direction of the advancing wavefront was determined by the local normal to the curved edge of the finger.

In the fabrication process that Eichenfield 2013 and Olsson 2009 reported, a high resistivity six-inch silicon wafer was overcoated by deposition of a 0.6 µm oxide layer followed by a 4 µm polysilicon release layer. The polysilicon was patterned to define the locations of release trenches where the AlN membranes would be undercut and suspended.

An oxide layer was deposited and chemically-mechanically polished to expose the patterned polysilicon release layer. Tungsten plugs were machined into the oxide for contact to the bottom electrode.

The electrically grounded bottom electrode, formed from 20/20/50 nm of Ti/TiN/Al, was then deposited and patterned. A 0.75 µm layer of AlN was sputter deposited. Vias were etched in the AlN, landing on the tungsten plugs. A top electrode layer of 70/20 nm of Al/TiN was deposited and patterned to form the piezoelectric transducers.

The release trenches were then etched to expose the polysilicon release layer and to concurrently create back reflectors and waveguides. The device was suspended from the substrate using a dry release etch in xenon difluoride.

Although the fabrication process described above is directed to devices formed on suspended membranes of aluminum nitride, those skilled in the art will recognize that with suitable modifications, a similar process can be applied to suspended membranes of lithium niobate, among other materials, and as such can readily be integrated with the LN fabrication process to be described below.

Figure 3A:
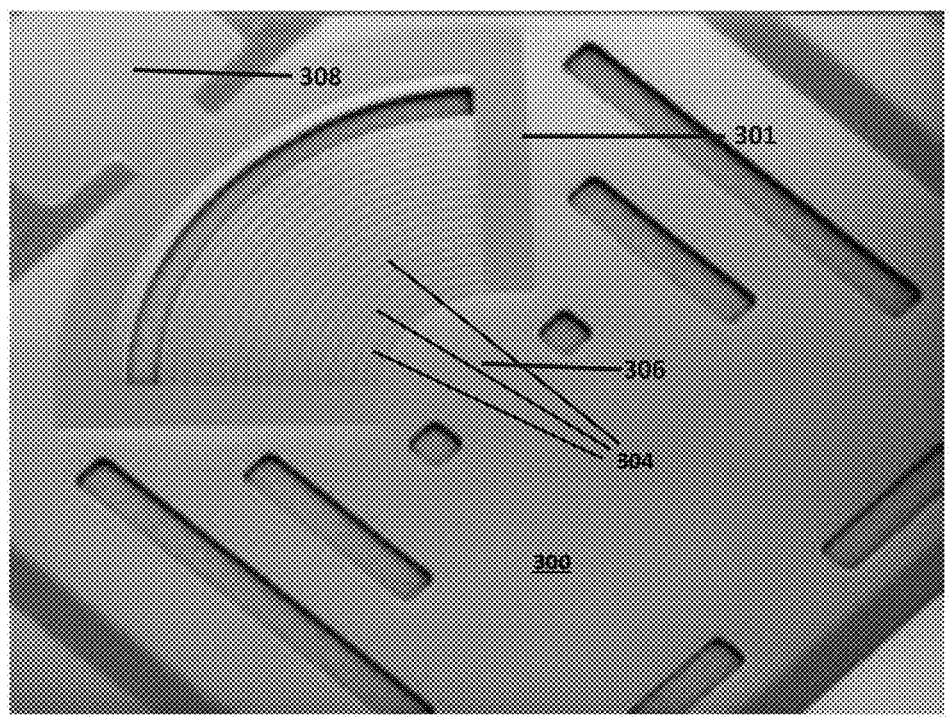
FIGS. 3A and 3B provide an example of a focusing transducer of the prior art that is useful in connection with embodiments of the present invention.
Figure 3B:
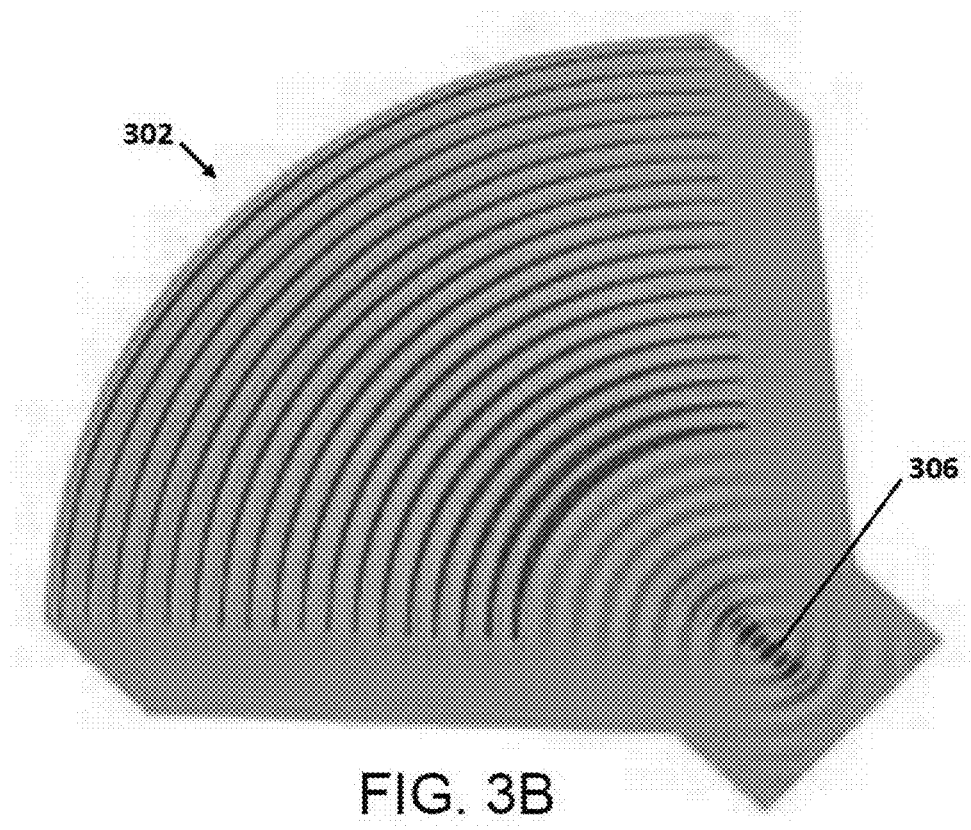

FIGS. 3A and 3B provide an example of a focusing transducer of the kind described by Olsson 2009 and Eichenfield 2013. FIG. 3A is a top-down view 300 based on an electron micrograph of a fabricated transducer. FIG. 3B is a perspective diagram 302 based on a numerical simulation. The diagram 302 includes shading to indicate the propagating acoustic wave. The electrode fingers 304 of the transducer are visible in FIG. 3A.

In the example transducer, 2-GHz energy is focused to a diffraction-limited spot 306. In specific implementations, the impedance ratio and voltage step-up will depend on the focused spot size and transduction back into the electrical domain from the acoustic domain.

The example transducer of FIG. 3A is a single-port transducer implemented in aluminum nitride 750 nm thick. It is made up of 18 curved electrode fingers 304. Each finger varies in width across the extent of the finger, and each finger is different in width from all the others. With careful design of the variable shapes of the fingers, the acoustic outputs of all the fingers can be added coherently such that they add up to a Gaussian (diffraction limited) beam.

The radio-frequency (RF) input is applied between pad 308 and a ground plane on the bottom side (as seen in the figure view) of the device. Bus 301 distributes the RF input, in parallel, to all of the electrode fingers.

Figure 4A:
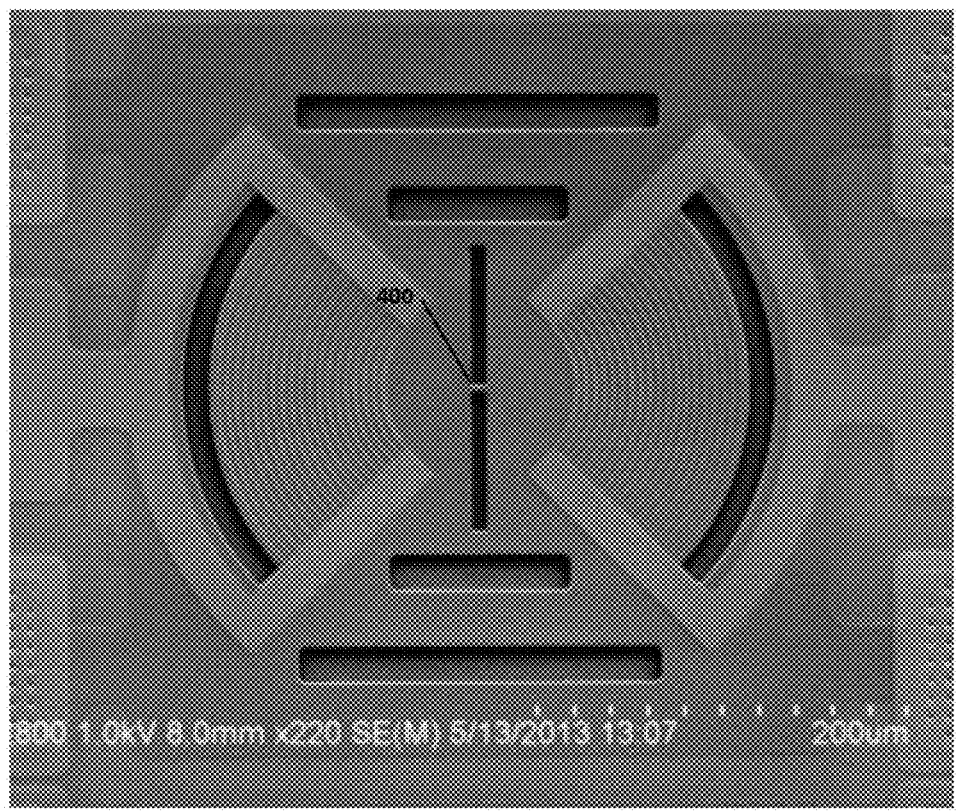
FIGS. 4A and 4B illustrate arrangements, useful in connection with embodiments of the present invention, in which a focusing transducer of the prior art is coupled into an acoustic waveguide.
Figure 4B:
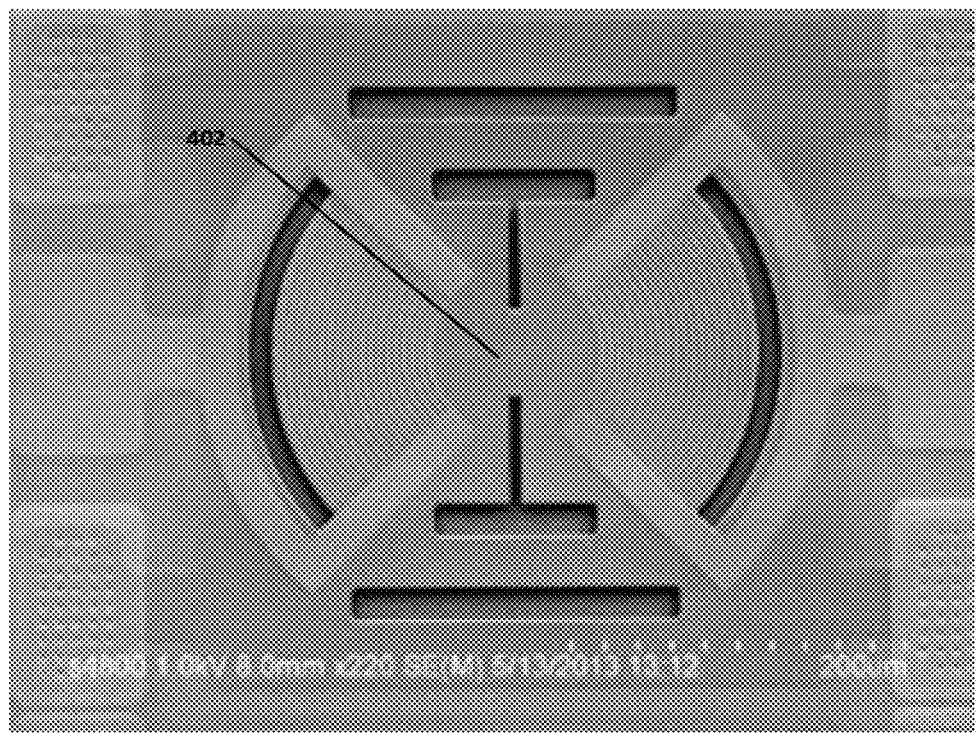
Figure 4C:
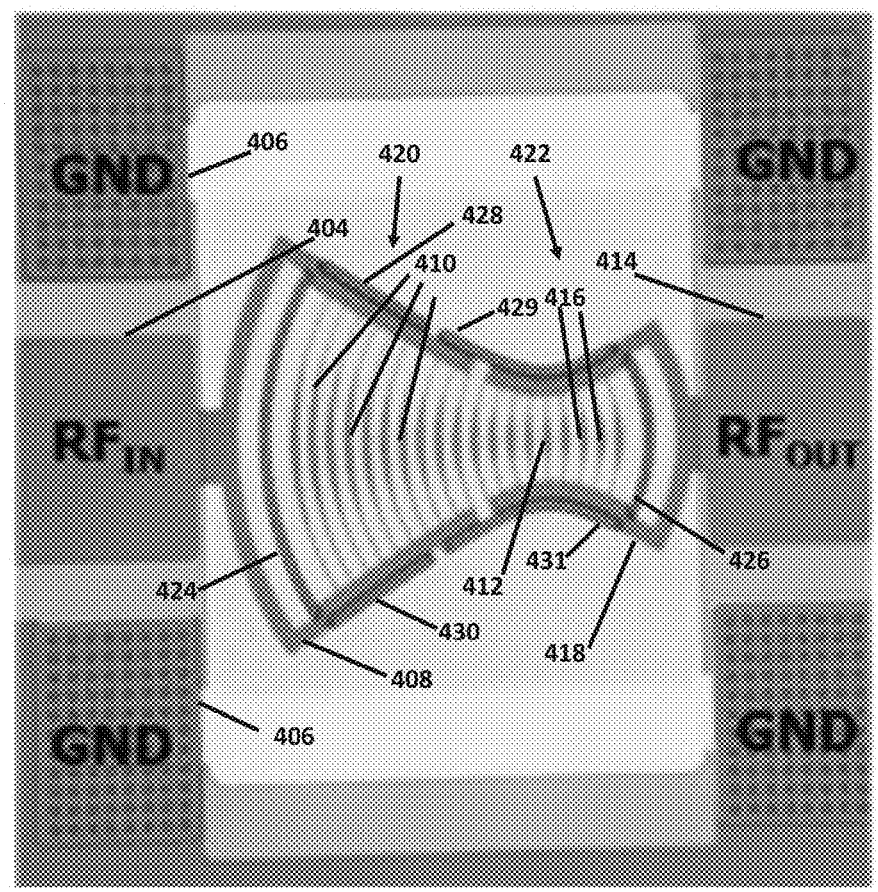
FIG. 4C is a plan view of a dispersive impedance transformer that, as noted above, incorporates piezoelectric focusing transducers fabricated in AlN.

The transducer design of FIG. 3A can be modified to provide a transformer. A transformer would include a second fan-like array of electrode fingers on the side of focal region 306 opposite to electrode fingers 304, and it would include a back reflector behind the second electrode array. FIG. 4C, which is discussed below, provides an example of such a transformer.

A transducer of the kind described above can generate acoustic power with a transducer area large enough to give a 50Ω impedance while focusing all of that power to a diffraction-limited spot a short distance away, giving an exceedingly high voltage step-up in a compact space. The original work reported in Eichenfield et al. described operation at an exemplary RF frequency of 2 GHz, but the design is readily adapted to any frequency by simply scaling the geometry.

At 1 GHz in 1.5 um thick aluminum nitride (AlN), for example, a 50Ω transducer has a capacitance of 3.2 pF, which corresponds to an area of $A_{50\Omega}=(234\ \mu m)^2=(23\lambda)^2$ (since the acoustic wavelength at 1 GHz is 10.2 µm at a speed of sound of 10.2 km/s). At the focus of the transducer, less than 100 µm from the output, the power is concentrated to a spot that is roughly of the dimensions $(\lambda/2)\times\lambda$ (half a wavelength times the diffraction-limited diameter of $\lambda$), which can be received by a single transducer finger having the same area.

Neglecting parasitic capacitance, this finger has a capacitance that is 46 times smaller than the transducer; in the absence of insertion loss, then, the voltage must step up by a factor of 46 to conserve power.

Focusing can also be accomplished by alternate means such as graded index lenses and horns. However, these alternate approaches might not be as desirable because they suffer from larger insertion loss and must be larger in length to accomplish the same degree of focusing.

Time Compression

If desired, dispersion and delay can be achieved in the piezoelectric device by, e.g., focusing the energy at the input of a half-wavelength wide acoustic waveguide. The narrow waveguide will generate signal dispersion for pulse compression, and delay will be generated by the time-of-flight on the waveguide. Other dispersive structures such as phononic bandgap waveguides may also be useful in this regard.

More specifically, time compression can be used to create a pulsed output that is a combination of the frequencies in the input chirp. Consider, for example, a swept frequency source that sweeps from $f_2$ to $f_1$ ($f_2 > f_1$) in a time $\Delta t$ with constant amplitude (A); if this source is used to excite a waveguide that has a lower speed of sound at $f_2$ than at $f_1$ (i.e., $v(f_2)=v_2<v_1=v(f_1)$), then the waves at $f_1$ generated later in time will catch the $f_2$ waves in a length $L=v_2 v_1 \Delta t/\Delta v \approx (v_{av})^2 \Delta t/\Delta v$, where $\Delta v = v1 - v2$ and $v_{av}=\text{mean}(v_1, v_2)$. At the point in space where the waves overlap, the superposition will create an RF pulse with an amplitude that is larger than A by a gain of $G=(f_{high}-f_{low})\Delta t$. If $\Delta t$ is 0.5 µs and $(f_{high}-f_{low})=20$ MHz (2% bandwidth at 1 GHz, which is the maximum transducer bandwidth possible for a 50Ω transducer in AlN), then G=10.

Thus, by using a dispersive waveguide, we can step up the voltage of a swept input to a much larger level than the average voltage of the swept source. However, even with a rather large dispersion of $\Delta v = 1$ km/s over 20 MHz, the waveguide length required would be 5 cm. The material-limited loss of AlN at 1 GHz would give approximately 2 dB of loss in 5 cm.

This shows that longer lengths would lead to prohibitively high losses, unless even higher levels of dispersion could be provided. We believe that sufficiently high levels of dispersion could be provided by using a phononic crystal waveguide with wavelength scale dimensions. For such an approach to be effective, it would be necessary to efficiently couple the acoustic energy from a 50Ω transducer into a wavelength-wide waveguide.

In fact, the focusing transducer discussed above could very efficiently couple into such a waveguide. For example, FIGS. 4A and 4B respectively show two implementations, in each of which two, 2-port focusing transducers are connected by a waveguide. In FIG. 4A, the connecting waveguide 400 is 0.5λ wide. In FIG. 4B, the connecting waveguide 402 is 10λ wide.

Only 0.5 dB extra insertion loss is predicted in going through the 0.5λ waveguide compared to the 10λ waveguide (at 2 GHz). Thus, we believe that our focusing transducers can be used to couple a predominance of the acoustic energy from a 50Ω transducer into a waveguide that is dispersive enough to get the high voltage gain described above.

FIG. 4C is a plan view of a dispersive impedance transformer that, as noted above, incorporates piezoelectric focusing transducers fabricated in AlN. As seen in the figure, the RF input is applied between input pad 404 and ground plane 406 (portions of which are visible in the figure). From pad 404, the RF input is distributed by bus 408 to electrode fingers 410, which are concave from the left (as seen in the figure view) toward focal region 412. The RF output is received from output pad 414, relative to the ground plane. Electrode fingers 416 feed bus 418, which directs the RF output to the output pad. Fingers 416 are concave from the right (as seen in the figure view) toward the focal region. The gain of the transformer is nominally determined by the ratio of the active area of input stage 420 to output stage 422.

In operation, the voltage on the electrode fingers is piezoelectrically converted in the input stage to an acoustic strain wave that propagates laterally between reflector 424 and reflector 426. In the output stage, the strain in the piezoelectric medium generates a voltage on the output electrode fingers.

Also visible in the figure are etch pits 428, 429, 430, and 431, which help to confine the acoustic wave. The etch pits and the reflectors are fabricated concurrently in the same etch process.

The widths of the electrode fingers have a Gaussian profile, which is clearly seen in the figure as a thickening toward the center of each finger.

More information on the design and fabrication of piezoelectric focusing transducers is provided below, in the section titled "Design and fabrication of piezoelectric focusing transducers".

Several alternative types of piezoelectric transformer may also be useful in this regard. For example, C. Cassella et al., "RF Passive Components Based on Aluminum Nitride Cross-Sectional Lamé-Mode MEMS Resonators," *IEEE Trans. Electr. Dev.* 64 (2017) 237-243, reports on a so-called cross-sectional Lamé-mode transformer operating in the frequency range near 920 MHz. This transformer is based on the transduction of a Lamé mode in the cross section of an AlN plate through the combined use of both the $e_{31}$ and $e_{33}$ piezoelectric coefficients of AlN.

Similarly, R. Lu et al., "Piezoelectric RF Resonant Voltage Amplifiers for IoT Applications," *Microwave Symposium (IMS), 2016 IEEE MTT-S International*, reports on a voltage amplifier utilizing the S0 lateral mode of vibration of a suspended AlN piezoelectric thin film with patterned metal interdigitated transducers. T. Manzaneque et al., "A High FOM Lithium Niobate Resonant Transformer for Passive Voltage Amplification," *Transducers* 2017, Kaohsiung, Taiwan, Jun. 18-22, 2017, IEEE, pp. 798-801, reports on a similar device implemented in lithium niobate.

Resonant MEMS Switch

The comparator stage of our RF detector is a resonant MEMS switch. An example of a resonant MEMS switch is illustrated notionally in FIG. 5. Such a switch provides the benefits of very steep sub-threshold slope and mechanical energy storage. Pertinent metal contact switches, nanoscale switches, and resonant switches are described, respectively, in the following references, the entirety of each of which is hereby incorporated herein by reference: C. D. Nordquist, et. al, "A DC to 10 GHz 6-b RF MEMS Time Delay Circuit," *IEEE Microwave and Wireless Component Letters*, vol. 16, no. 5, pp. 305-307, May 2006, D. A. Czaplewski, et. al, "RF MEMS Switches with RuO2-Au Contacts Cycled to 10 Billion Cycles," *J. Microelectromech. Syst.*, v. 22, no. 3, pp. 655-661, June 2013, and G. N. Nielson, et. al, "Dynamic Pull-In and Switching for Sub-Pull-In Voltage Electrostatic Actuation", *Trans.* 2007, pp. 455-459, June 2007.

Nanoscale contact switches for high-sub-threshold-slope logic are described in D. A. Czaplewski, et al., "A nanomechanical switch for integration with CMOS logic," *J. Micromechanics Microengineering*, vol. 19, p. 085003, 2009, the entirety of which is hereby incorporated herein by reference.

For reliability, the switch is advantageously fabricated using ruthenium as a contact and body material. Known methods of microfabrication can be used to make the switch.

Figure 5:
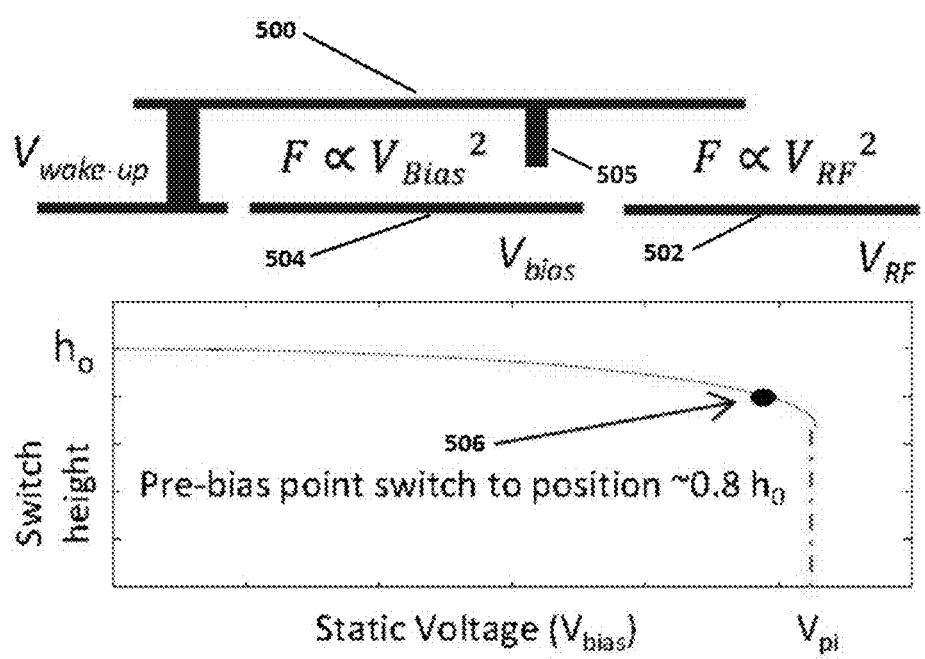
FIG. 5 is a notional diagram of an exemplary resonant MEMS switch useful in connection with embodiments of the present invention.

In the non-limiting example of FIG. 5, the switch has a cantilevered bridge beam 500 (hereinafter, the "bridge"), an actuation pad 502, and a bias pad 504. The bridge is connected to the wake-up signal output $V_{wakeup}$, the stepped-up input signal $V_{RF}$ is connected to the actuation pad, and the bias pad 504 (also referred to herein as the lower contact pad) is connected to the bias voltage $V_{bias}$ (also referred to herein as the "pre-bias" voltage or the "wakeup" voltage). The bridge will be at or near 0 V when the switch is open. When the bridge and bias pad make contact, $V_{bias}$ is transferred to the bridge, raising the bridge (and its attached circuitry) to $V_{bias}$ through the external resistance.

Also seen in the figure is a feature 505 projecting downward from the lower side of the bridge. We refer to this feature as the "contact dimple". The contact dimple defines the area of the switch that makes actual contact with the bottom electrode (bias pad) 504.

The switch will remain closed until the bias is removed, which allows the switch to re-open. The input capacitance will be determined by the size of the switch. For example, an actuation electrode area of 16 μm² provides a capacitance of approximately 3 fF for a 0.05-μm gap at 100 MHz.

It is necessary to utilize mechanical resonance in the operation of the switch because the RF voltage will generally be too weak to reliably actuate a practical device by direct application of a single pulse. Instead, the application of a sequence of low-voltage RF pulses at the mechanical resonant frequency of the switch will allow the build-up of energy as mechanical motion, as discussed in Nielson et al., cited above.

More specifically, the electrostatic attraction between the bridge and the actuation pad is proportional to the square of the RF voltage, hence it is positive for both positive and negative RF voltages. This rectifies the RF envelope so that there is only a positive force on the bridge. This mechanical motion will build as more pulses are applied, until the switch is captured and closed by the electrostatic pre-bias.

The paper W.-C. Li, Y. Lin, and C. T.-C. Nguyen, "Metal Micromechanical Filter-Power Amplifier Utilising a Displacement-Amplifying Resonant Switch," *TRANSDUCERS* 2013, pp. 2469-2472, June 2013 (hereby incorporated herein by reference in its entirety) describes resonant switches at the RF carrier frequency, but actuation at the PRF of an RF envelope remains unexplored, to our knowledge.

Our switch will respond only to the designated pulse repetition frequency (PRF), and in implementations it will draw negligible current (i.e. current less than 10 pA, and possibly even less than 1 pA) when not moving. A voltage applied to the bias plate (referred to herein as a "pre-bias voltage") reduces the energy required for pull-in, provides pull-in force, and latches the switch in the closed state. In the lower portion of the figure, an example plot is provided of switch height versus bias voltage. A pre-bias point 506 is indicated on the plot, where the switch is set to about 80% of its maximum height ho.

Exemplarily, the switch is reopened after a wakeup event has been recorded by opening a high-side FET or similar switch (shown as element 112 in FIG. 1), thereby momentarily removing the applied bias.

The energy ($E_{switch}$) stored within the switch is estimated as $\frac{1}{2}kx^2$, where k is the spring constant and x is deflection. For very small switches, this quantity may be as small as 5 fJ or even less. For example, a switch with a spring constant of 5 N/m and a maximum deflection of 33 nm ($\frac{1}{3}$ of a 0.1-μm gap) will store 2.7 fJ of power at resonance.

The number of pulses required to trip the switch will be a function of $E_{switch}$ and the pulse energy. In any event, however, the number of pulses will generally be on the order of the mechanical Q of the switch or less. This can be understood from the following argument: The maximum amount of energy stored by the switch is Q multiplied by the input energy per cycle. Hence most of the energy that is ultimately stored by the switch is the energy built up within the first q cycles, where q is the closest integer to Q, and further cycles will merely replace energy that is lost within the switch. (The switch loses 1/Q of the stored energy in each cycle.) After roughly Q cycles (in practice, this figure is more typically close to 2Q cycles), the switch motion ceases to increase further, and there is no reason to introduce more power.

In specific applications, the spring constant that characterizes the switch bridge will need to be selected according to a suitable compromise between the objective to minimize triggering energy and the objective to provide restoring force sufficient to reopen the switch. (Alternatively, an active pull-off mechanism can be used to reopen the switch.)

For resonant operation, it is desirable for the switch to have a high mechanical quality factor (Q). This is best achieved with vacuum packaging of the switch.

Accordingly, the switch and transformer are advantageously integrated into a vacuum package. Flip-chip bonding, especially if it uses miniature stud bonds, is desirable because it helps to obtain a low interconnect capacitance. External connections are preferably low impedance (50Ω) or low speed (DC), so they are relatively insensitive to capacitance. A typical flip-chip connection would be made using small gold bumps for electrical interconnection between the two components.

Monolithic integration offers the possible advantage of lower parasitics. However, a two-chip solution may be preferable for at least some applications because it permits the transformer and the switch to be optimized independently of one another.

An example vacuum package takes as input the 50Ω signal from an antenna connector, and it provides as output the drive signal to the wake-up electronics. Another package input provides the bias signal.

Figure 6:
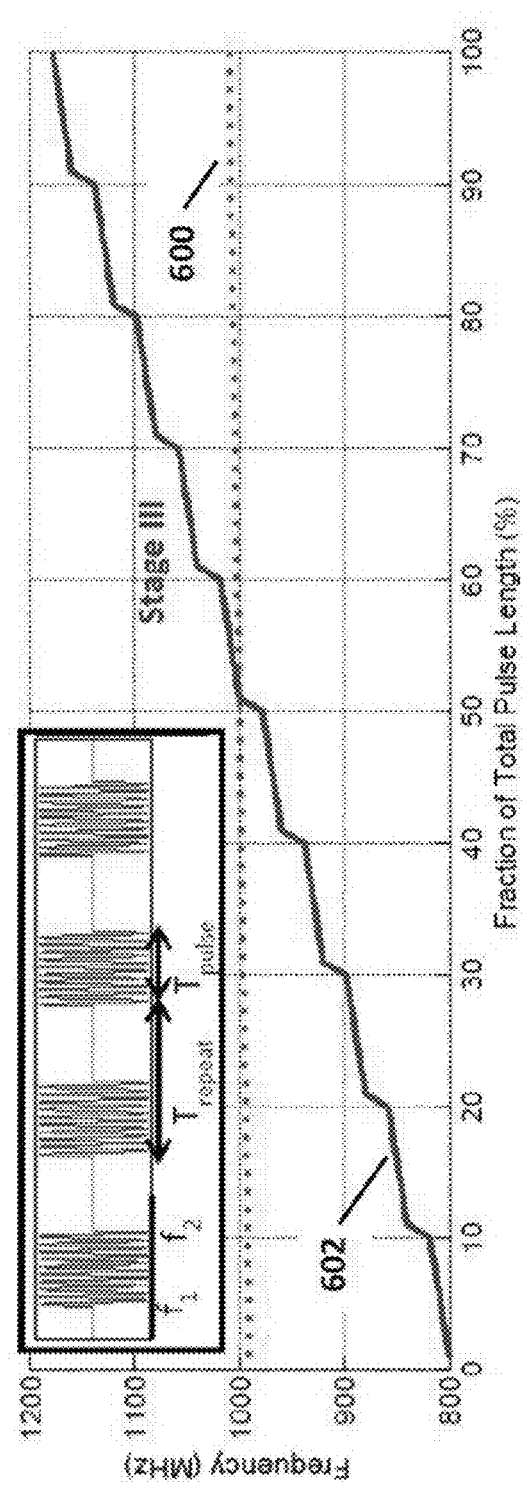
FIG. 6 is a plot of frequency versus temporal position within an actuation pulse, providing two examples of a chirped waveform that may be suitable as an RF wakeup signal for the resonant switch described here. As seen in the inset of the figure, the waveform is a train of discrete pulses with the RF carrier frequency varied over the duration of a pulse.

FIG. 6 provides two examples of a waveform that may be suitable as an RF wakeup signal for the resonant switch. The waveform has an envelope produced by on-off keying (OOK). The center frequency of the carrier wave is matched to the center frequency of the resonant transformer, which in an illustrative example is 100 MHz.

As seen in the inset of the figure, the waveform is a train of discrete pulses having a repetition period $T_{repeat}$ and a pulse length $T_{pulse}$. Within each pulse, a carrier wave oscillates at a constant frequency or, if the pulses are chirped, at a frequency that varies from $f_1$ to $f_2$.

As seen in the main portion of the figure, curve 600 represents a chirped carrier frequency that varies smoothly over the full length of a pulse. In the illustrated example, $f_1$ is about 990 MHz and $f_2$ is about 1010 MHz. Such a waveform can be subject to pulse compression by dispersive elements such as the focusing transducer or downstream dispersive elements. Provided that the range from $f_1$ to $f_2$ lies within the bandwidth of the dispersive element (e.g., a bandwidth of 20 MHz), the energy within each chirped pulse will be concentrated into a pulse of higher amplitude, which may be sufficient for resonant actuation of the switch.

As also seen in the main portion of the figure, curve 602 represents a pulse consisting of multiple (ten in this example) time-sequenced chirps, each occupying one-tenth the total pulse duration. These individual chirps are intended to match respective dispersive filters in a filter bank coupled to corresponding time-delay elements. Thus, each chirp (i.e., each respective 10% pulse segment) is time-compressed within a respective frequency-matched filter while being rejected by the other filters of the filter bank. The respective filter outputs are recombined with suitable time delays to provide a single, composite, output pulse per pulse repetition period $T_{repeat}$. The respective pulse segments can be added with the use of a series combination of output transducers. Alternatively, they can be added using separate gate electrodes at the input to the MEMS switch.

It should be noted in this regard that the discontinuous frequency steps seen between pulse segments in curve 602 are intended for avoidance of energy loss in the crossover bands between filters. It should also be noted that although the frequency is shown in curve 602 as increasing with each successive step, this is not an essential requirement. Other sequences may be used, for example to reduce the incidence of false positives or to provide individual addressing.

In an example, the sequence of frequency steps is designed to be a pseudorandom frequency sequence. Such a sequence is less likely to appear by random or in noise. Thus the probability of false alarm (PFA), i.e. the probability that the device will wake up to unintended signals, is reduced.

We have found that power is preferably applied to the input of the switch only while the gap is closing in order to add energy to the switch motion. Any power applied while the gap is increasing will remove energy from the switch. Moreover, if the input power is constrained by a maximum input voltage, it is best to apply the RF pulse during the entire half-cycle when the switch is approaching the electrode. If the average input power (but not peak voltage) is constrained, it is best to apply the energy within as short a pulse as possible while the switch is moving through its neutral position with maximum velocity.

Example 1: Numerical Modeling

Figure 7:
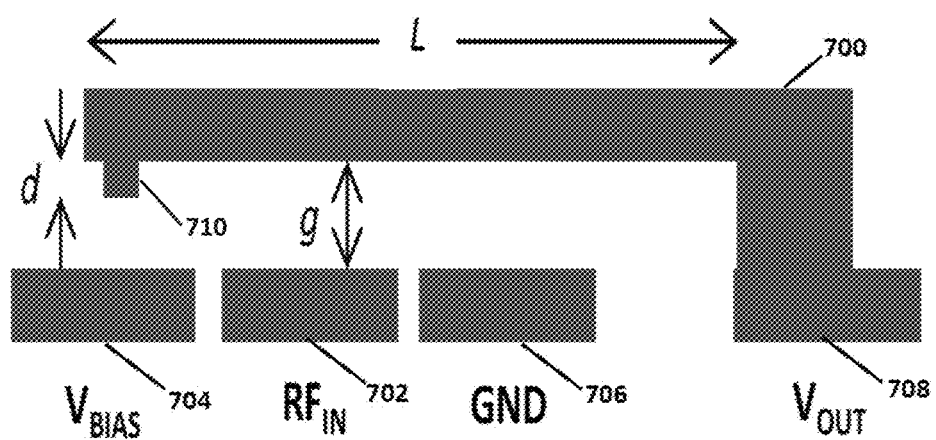
FIG. 7 is a diagram of a version of the resonant switch that was studied by numerical modeling.
Figure 8:
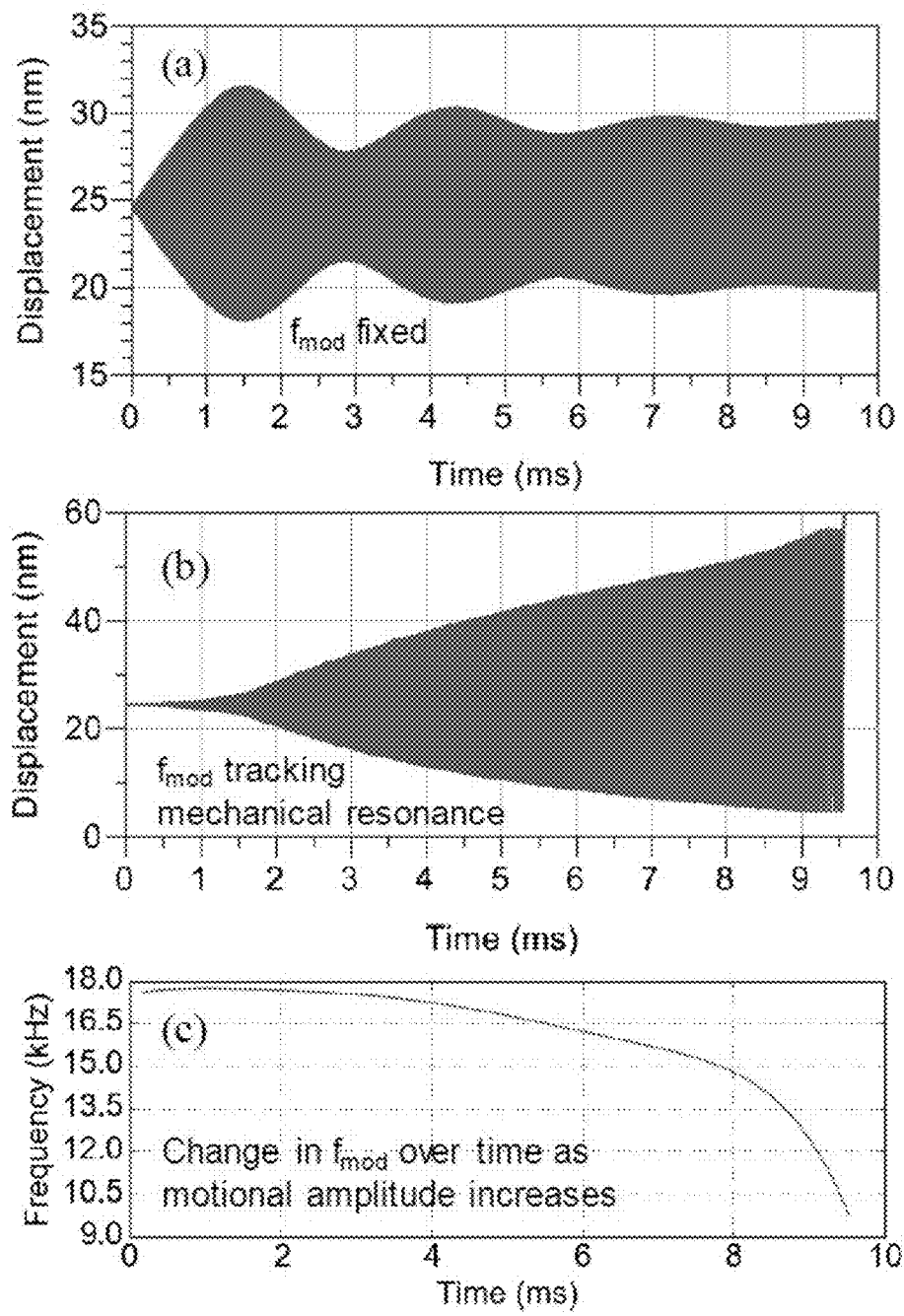
FIG. 8 illustrates certain results from our numerical modeling studies. View (a) of the figure is a plot of the displacement of the switch beam as a function of time for modulation at a fixed pulse frequency. View (b) is a plot of the beam displacement versus time under conditions of adaptive modulation, in which the pulse frequency tracks the mechanical resonant frequency. View (c) is a plot of the mechanical resonant frequency versus time, showing the softening of the effective spring constant causing a reduction in the mechanical resonant frequency as the amplitude of the switch motion increases.

FIG. 7 is a diagram of a version of the resonant switch that was studied by numerical modeling. The parts 700, 702, and 704 of the switch correspond respectively to the bridge beam 500, the actuation pad 502, and the bias pad 504 of the switch shown in FIG. 5. Also called out in FIG. 8 are ground pad 706, output contact 708, and the contact dimple 710.

Various switch dimensions are called out in FIG. 7. L is the length of the bridge, i.e. of the cantilever-supported switch beam. The symbol g represents the gap between the bridge and the actuation electrode. The symbol d represents the depth of the contact dimple. The amount of displacement required to close the switch is g-d.

The beam is connected to the output ($V_{OUT}$), which is grounded through the large (approximately 1 MΩ in this example) load resistor representing an integrated circuit pin. The DC voltage ($V_{BIAS}$) is applied to the bias electrode to deflect the switch to near pull-in; upon closure, the switch makes contact with the bias electrode and the potential on the switch beam rises to $V_{BIAS}$. The ground electrode holds the switch down after it has closed and the beam is at $V_{BIAS}$. Until the switch closes, currents are in the picoampere range, ensuring near-zero off-state power consumption.

The RF signal at the high-impedance control electrode produces an electrostatic force that deflects the beam. This force varies as the square of the input voltage. Because the switch's mechanical resonant frequency is much lower than the RF frequency, the switch responds to the average amplitude of the RF signal modulation of the signal, effectively serving as a rectifier. Averaged over an RF cycle, the force is given theoretically by:

$$F_{avg} = \frac{\varepsilon_0}{2g^2}\left(A_{bias}V_{bias}^2 + \frac{A_{RF}V_{RF}^2}{2}\right)$$

where $\varepsilon_0$ is the permittivity of free space, g is the gap between the bridge and the electrode, $A_{bias}$ and $A_{RF}$ are the areas of the bias and RF electrodes, and $V_{bias}$ and $V_{RF}$ are the DC bias and RF voltages. If the bias and RF voltages are on the same electrode, the result is the same because the cross-product terms have a higher frequency than the switch's mechanical response.

Pulses of RF energy delivered at the resonant frequency of the switch produce sequences of small input forces that cause increasing motional amplitude, effectively integrating the energy over multiple pulses. When the amplitude of motion has grown sufficiently, the switch is captured by the bias voltage and closes. Functionally, this provides a discriminator with high sub-threshold slope.

For switch closure to be achieved, the motional amplitude must grow large enough for the switch beam to be captured by the applied DC bias voltage. This is predicted to occur when the gap between the beam and bias electrode is at approximately one-third of the original gap.

The mechanical power theoretically required to sustain an amplitude of x is:

$$S = \frac{2\pi x^2 k_m f_{mech}}{Q}$$

where $k_m$ is the spring constant, $f_{mech}$ is the mechanical resonant frequency, and Q is the mechanical Q of the switch. The best sensitivity requires a low spring constant, a small gap, and a switch bias close to pull-in, selected to achieve a favorable tradeoff between sensitivity and reliability. It should also be noted that the conversion efficiency of RF energy to mechanical motion is affected by other loss mechanisms that scale as the square of the ratio between the RF and mechanical frequencies.

Our nonlinear numerical models for the switch were developed using both non-linear solvers and circuit simulators.

Our modeling results predicted that for optimum performance, the modulation of the drive signal would need to match the instantaneous resonant frequency of the device during the pulse sequence. That is, the energy is ideally applied for pulsed modulation only when the switch is moving toward the actuation electrode. As the amplitude of the switch motion increases, however, the resonant frequency decreases due to spring softening in the electrostatic drive signal. If the modulation frequency is held constant during the sequence, the switch motion will be limited by the mismatch between the drive and switch frequencies. If, on the other hand, the modulation frequency is actively matched to the instantaneous mechanical resonance of the switch, the motional amplitude will continue to increase until the switch closes. Such an adaptive approach minimizes both the required RF input power and the energy needed for switch closure.

For achievable switch gaps and spring constants, the models predict switch closure with voltages as low as 60 mV, corresponding to −45 dBm in a system with 100 kΩ input impedance (15 fF at a frequency of 100 MHz). This input impedance implies a voltage step-up ratio of 45× in a passive transformer, which is believed to be feasible if high-coupling piezoelectric materials are used.

FIG. 8 illustrates certain results from our numerical modeling studies. View (a) of the figure is a plot of the displacement of the switch beam as a function of time for modulation at a fixed pulse frequency. View (b) is a plot of the beam displacement versus time under conditions of adaptive modulation, in which the pulse frequency tracks the mechanical resonant frequency. View (c) is a plot of the mechanical resonant frequency versus time, showing the softening of the effective spring constant, which causes a reduction in mechanical resonant frequency as the amplitude of the switch motion increases.

Example 2: Experimental

Figure 9:
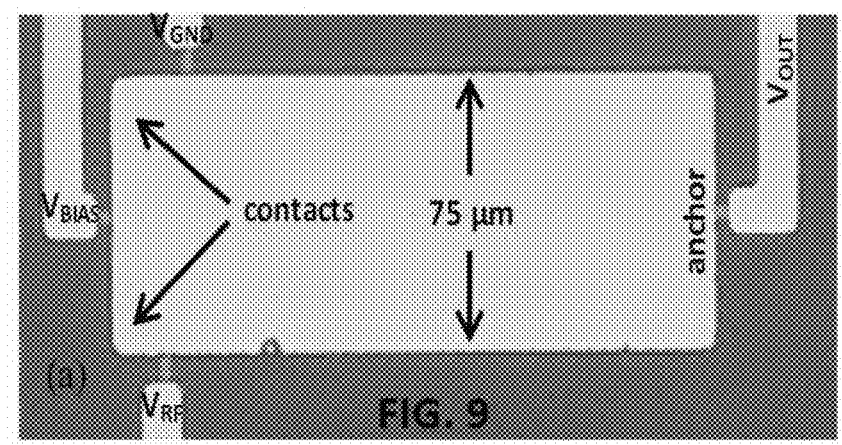
FIG. 9 provides a plan view of a fabricated prototype of a resonant MEMS switch as described here.
Figure 10:
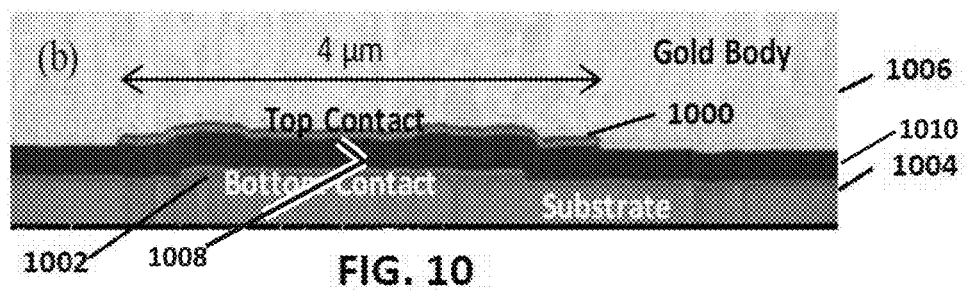
FIG. 10 provides an elevational sectional view of a portion of the switch of FIG. 9.

FIG. 9 provides a plan view of a fabricated prototype of our resonant MEMS switch. FIG. 10 provides an elevational sectional view of a portion of the switch. The view of FIG. 9 is based on an optical microscope and the view of FIG. 10 is based on a scanning electron micrograph. Contacts and electrical traces are visible in FIG. 9 for the bias, ground, actuation, and output signals $V_{bias}$, $V_{GND}$, $V_{RF}$, and $V_{OUT}$, respectively. Additionally, the legend "contacts" in FIG. 9 indicates the hidden locations of top contact 1000 and bottom contact 1002, which are shown explicitly in FIG. 10.

The scale of the drawings is indicated by the arrows in FIG. 9 indicating a width of 75 μm for the bridge, and by the double-headed arrow in FIG. 10 indicating a width of 4 μm for the top contact 1000.

In addition to the top contact, FIG. 10 shows bottom contact 1002, substrate 1004, and gold body (for the bridge) 1006. The top contact is formed on the lower surface of the bridge, and the bottom contact, which is at the level of the bias voltage, is formed on the upper surface of the substrate. The center portion 1008 of the top contact corresponds to contact dimple 710 of FIG. 7.

The top contact is deposited on a sacrificial layer 1010, and the gold body is likewise deposited over the sacrificial layer and over the top contact. As seen in the figure, the sacrificial layer has reproduced the topography of the bottom contact with additional elevation near the corners of the bottom contact, leading to a complex cross-sectional profile. As seen, this profile is reproduced in the deposition of the top contact. This topographic profile is not essential for the operation of the device, but rather is an artifact of the fabrication process.

In the view of FIG. 10, the sacrificial layer is still in place in order to simplify the cross-sectioning of the device. Prior to operation, the sacrificial layer is etched away to release the bridge so that it is suspended by its anchor over the substrate.

The anchor is made of gold. In the fabrication process, a hole to define the anchor is etched in the sacrificial material, and the gold conformally coats the sidewalls to form the anchor.

In the present example, the switch beam is a 5 µm-thick gold cantilever suspended over a quartz substrate. This combination of materials was chosen to minimize leakage currents and dielectric charging. The sacrificial layer is amorphous silicon, which was chosen to allow for $XeF_2$ dry release. The contacts are $Au/RuO_2$, which was chosen for its reliability and low adhesion.

Gold was deposited by electroplating in a mold over a sputtered Ti/Au seed metal layer. The amorphous silicon was deposited by PECVD. The gold seed layer was removing by ion beam etching.

In the present example, the beam length and width were 200 µm and 100 µm, respectively. The actuation gaps were 0.1-0.2 µm.

Process Flow.

The process flow is as follows:

The switches are fabricated on a 150 mm-diameter, 0.75 mm-thick quartz substrate using contact lithography. The bottom contact layer is 100 nm-thick ruthenium dioxide ($RuO_2$), which serves as the lower contact and provides traces on the substrate. A 100 nm-thick amorphous silicon (a-Si) sacrificial layer is deposited, and 2 µm-diameter openings are etched through this layer to form the contact dimples.

After the dimple openings are etched, additional a-Si is deposited to define the gap between the bottom of the dimple and the contact. By doing this, the dimple depth and contact gap are defined by material thicknesses rather than etch depths. This is desirable for improved accuracy. The dimple depth is determined by the first layer thickness, the gap between the contact, and the dimple is determined by the thickness of the second a-Si deposition. After the second silicon deposition, the anchors for the devices are etched through both silicon layers, stopping on the bottom $RuO_2$ layer.

After the sacrificial layers are deposited and etched, a Ti/Au (100 nm/100 nm) layer is sputter deposited on top of the wafer to serve as a conductive seed layer for gold electroplating. A 7 µm-thick photoresist electroplating mold is patterned, and gold is electroplated in the openings of the mold to a thickness of 5 µm. To release the switch, the seed metal layer is removed using ion beam etching, and the sacrificial layer is removed using a $XeF_2$ dry etch. Finally, the switch contacts are cleaned using a downstream $O_2$ plasma.

To determine the best waveform for switch actuation, we measured the velocity of a MEMS switch using laser Doppler vibrometry while actuating with a resonant waveform. A feedback loop produced a signal when the switch was moving downward, providing the ideal actuation waveform.

Figure 11:
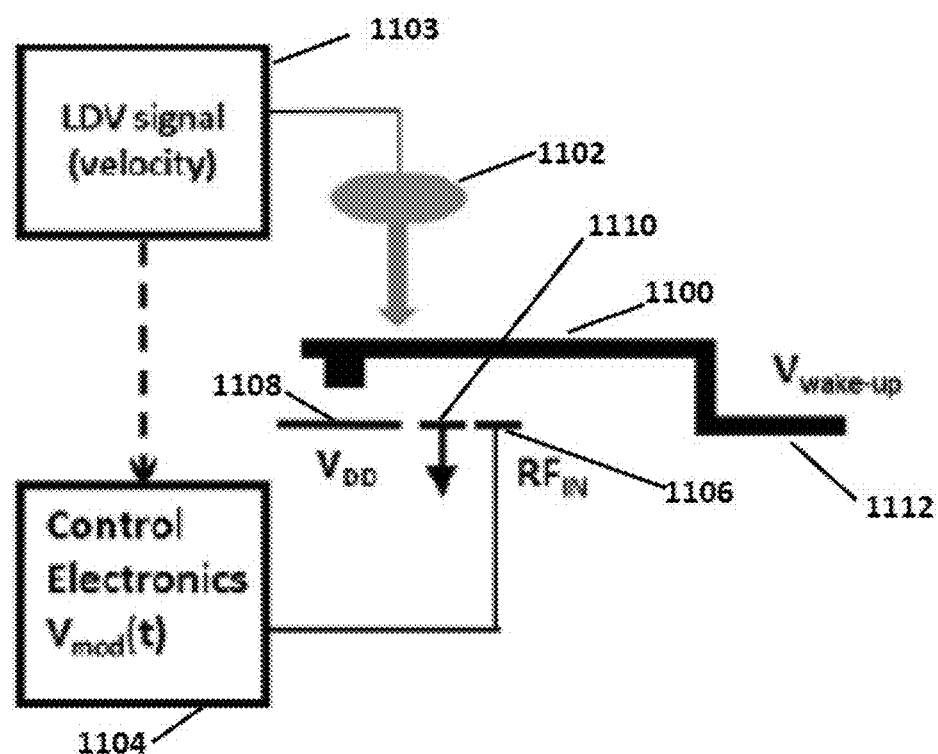
FIG. 11 is a schematic drawing of an example measurement and feedback system suitable for measuring the velocity of a MEMS switch while actuating the switch with a resonant waveform.

A suitable measurement system is illustrated schematically in FIG. 11. As seen in the figure, motion of the switch beam 1100 is sensed by laser Doppler vibrometer 1102, and the resulting velocity signal 1103 is transmitted to electronic control circuit 1104. The control circuit controls the modulation envelope $V_{mod}(t)$ such that an adaptive pulse stream is applied to the RF actuation terminal 1106. Also indicated in the figure are the bias electrode 1108, the ground electrode 1110, and the output terminal 1112.

As those skilled in the art will appreciate, any of various other sensors may be substituted in place of a laser Doppler vibrometer, provided they can supply a suitable velocity signal. Possible alternative sensors include ultrasonic sensors, capacitive sensors, and sensors measuring displacement of a reflected optical beam.

For practical implementation, it would be typical to use a vibrometer to characterize the switch velocity and optimize the waveform. The desired waveform would then be stored for use in the wake-up transmitter to actuate the MEMS switch when desired.

Figure 12:
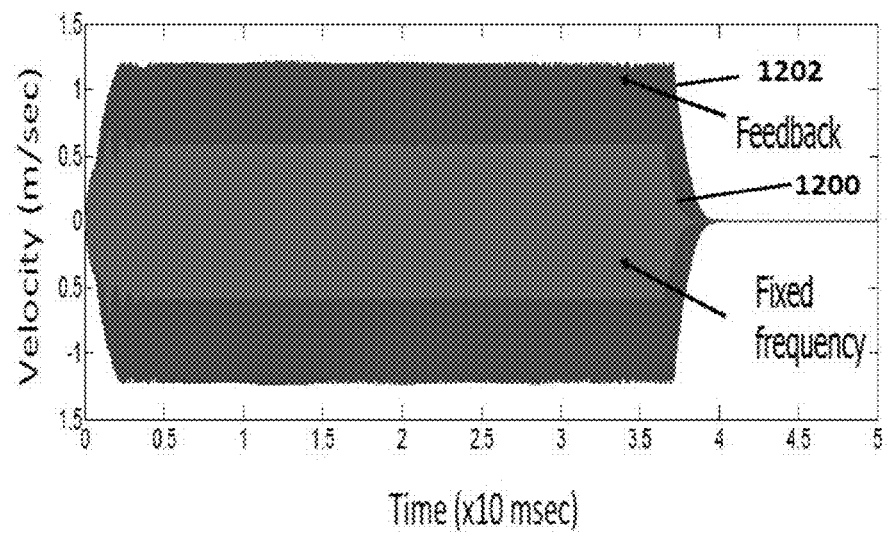
FIG. 12 shows comparative experimental measurements of switch velocity as a function of time in response to a fixed drive frequency and in response to an adapted drive frequency.

FIG. 12 shows experimental measurements of the switch velocity as a function of time in response to a fixed drive frequency (inner envelope 1200) and in response to an adapted drive frequency (outer envelope 1202). As seen in the figure, adapting the drive frequency to the resonant frequency of the device doubled the switch velocity, thereby quadrupling the stored energy.

Figure 13:
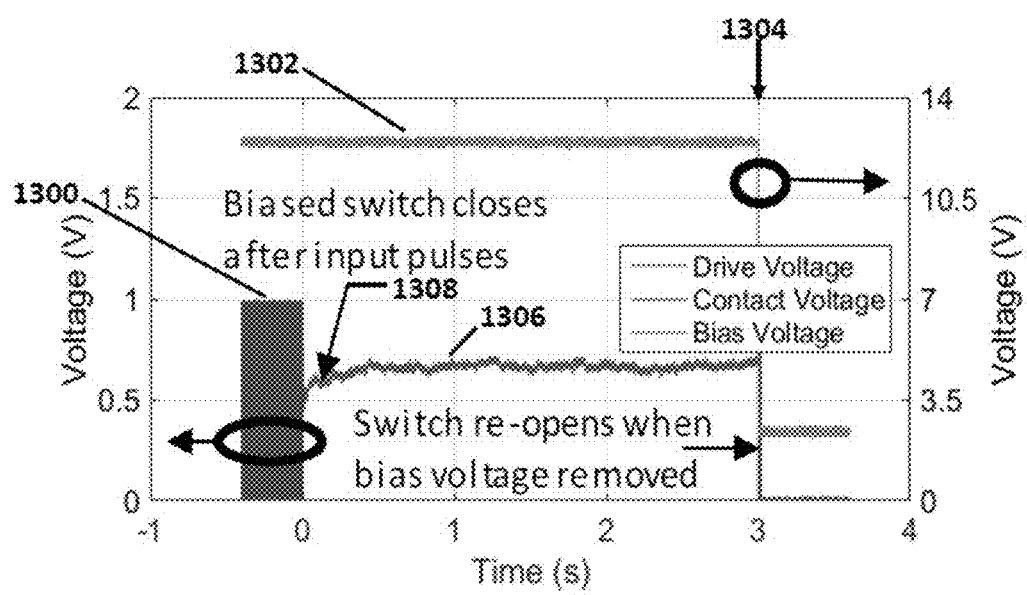
FIG. 13 illustrates a sequence, represented by three plots of voltage as a function of time, in which a train of actuation pulses causes switch closure. The respective plots represent the actuation pulses, the bias voltage, and the contact voltage at the switch output terminal.

FIG. 13 illustrates a sequence, represented by three plots of voltage as a function of time, in which a train 1300 of actuation pulses causes switch closure. The bias voltage 1302 is maintained constant during actuation. At point 1304, subsequent to switch closure, the bias voltage is removed and the switch reopens. The contact voltage 1306 at the switch output terminal is seen to go high at point 1308, upon switch closure, and to go low at point 1304, when the bias voltage is removed.

Example 3: Experimental

A resonant switch was made as described above. The nominal switch parameters are given in Table 1.

TABLE 1

| Symbol | Description | Value |
| --- | --- | --- |
| L | Switch Beam Length | 225 µm |
| W | Switch Beam Width | 100 µm |
| g | Electrode-Beam Gap | 240 nm |
| d | Switch dimple depth | 120 mn |
| t | Switch beam thickness | 5 µm |
| $A_{RF}$ | RF actuation electrode area | 400 µm² |
| $A_{BIAS}$ | DC contact & bias electrode area | 600 µm² |
| $A_{GND}$ | GND electrode area | 1000 µm² |
| $C_0$ | Neutral switch capacitance[a] | 15 fF |
| $x_{closure}$ | Amplitude required for closure[c] | 80 nm |
| $\omega_{merch}$ | Mechanical resonant frequency[a] | 2π * 32 kHz |
| k | Spring constant[a] | 100 N/m |
| Q | Mechanical quality factor[b] | 2000 |
| $R_{series}$ | Input series resistance[b] | 1 Ω |

[a]Values calculated from switch dimensions
[b]Based on measured values
[c]Assumed to be 1/3 of initial gap The switch closure was characterized as a function of RF input power and bias voltage both with and without the presence of added noise. An arbitrary waveform generator was used to produce a pulse train, which was used to modulate an RF synthesizer. The pulse-modulated RF waveform was delivered to the RF input of the switch. An additional broadband noise signal was combined with the drive waveform and applied to the same input of the switch.

Figure 14:
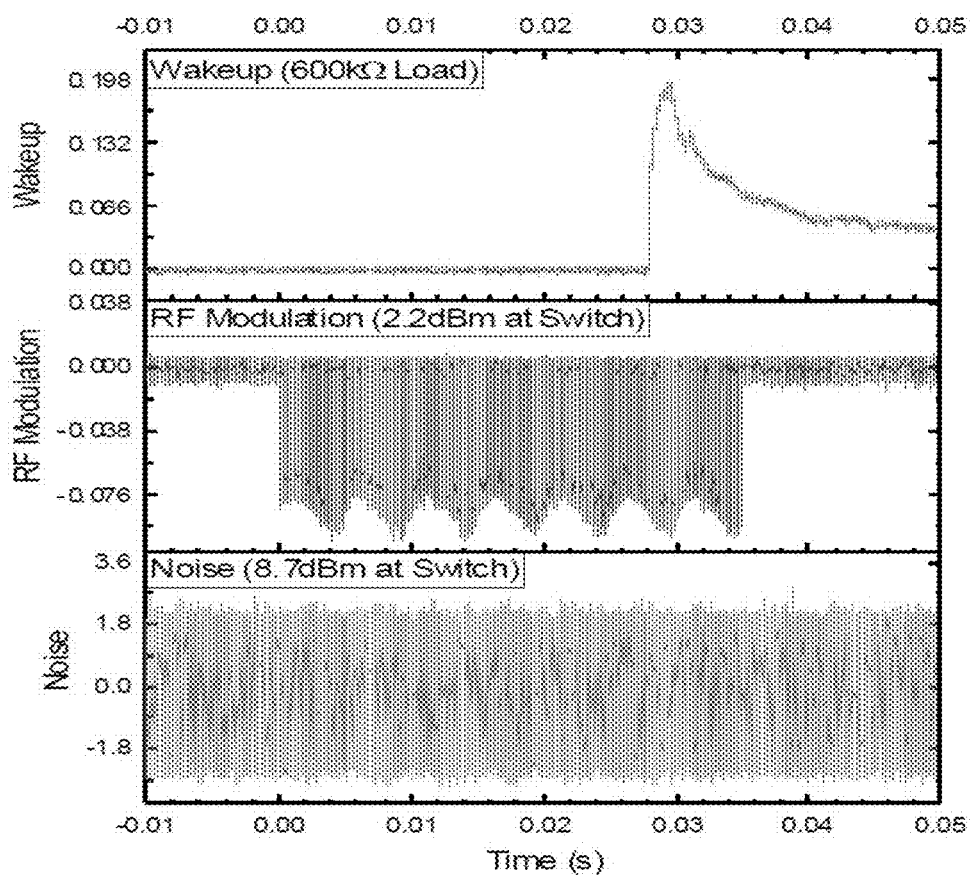
FIG. 14 is a plot of the experimentally measured response of an example resonant switch to an applied pulsed waveform according to principles described herein.

The response of the switch to the applied pulsed waveform is shown in FIG. 14. The switch pull-in voltage was measured immediately prior to the experiment, and the bias voltage was set to 0.1 V below the 12 V pull-in voltage. The modulation signal had a starting frequency of about 20 kHz and an ending frequency of about 10 kHz. The RF signal frequency was 1 GHz and had a power of 2.2 dBm. An additional noise signal with an average power of 8.7 dBm was also applied to the switch.

The switch is seen to close approximately 27 milliseconds after the RF signal is applied. This is for an RF input open-circuit voltage amplitude of 800 mV, corresponding to a power of 2.2 dBm when referred to 50Ω. This demonstrates the ability of a MEMS switch to close under an applied modulated RF waveform, and it also demonstrates the signal selectivity provided by the resonant drive, even without additional filtering at the switch input.

Design and Fabrication of Piezoelectric Focusing Transducers

Design

A focused acoustical beam can be accurately described as a Gaussian optical beam in two dimensions, and its field profile is specified by its confocal parameter, $z_0$, and wavelength, $\lambda$. The confocal parameter and wavelength determine the beam waist $w_0$ and beam divergence $\theta_D$. Mathematically the field displacement is accurately described as $$u = \hat{z}\alpha_{p,m}(y)\frac{1}{4\pi}\frac{e^{-ik(z+jb)-ik\frac{x^2+y^2}{2(z+jz_0)}}}{\sqrt{z+jz_0}} + \hat{y}\beta_{p,m}(y)\frac{e^{-ik(z+jz_0+\frac{1}{2}\pi)-ik\frac{x^2+y^2}{2(z+jz_0)}}}{\sqrt{z+jz_0}}, \quad (\#.1)$$

where z is the radial direction of propagation component and y is the out of plane component in cylindrical coordinates, and the functions $\alpha_{p,m}(\gamma)$ and $\beta_{p,m}(\gamma)$ are trigonometric functions of y that satisfy open boundary conditions and account for modes that are higher-order along the film thickness.

Furthermore the beam waist, radius of curvature and phase as a function of propagation distance (i.e. w(z), R(z), and θ(z), respectively) can be specified as follows:

$$w(z) = w_0\sqrt{1+\left(\frac{z}{z_0}\right)^2} \quad \tan\frac{\theta(z)}{2} = \frac{z}{z_0} \quad \pi w_0^2 = \lambda z_0 \quad \theta_D = \frac{w_0}{z_0} \quad (\#.2)$$
$$R(z) = z\left(1+\left(\frac{z_0}{z}\right)^2\right)$$

The focused acoustic beams have wave amplitudes that vary along constant phase contours, having a maximum along the propagation axis. In order to generate such beams, the electrode finger widths must be spatially varying along the transducer length.

The field amplitude of waves emitted in the immediate vicinity of a given local section of an electrode finger depends on the local width (relative to the normal) $L_{local}(s)$ at position s along the curved transducer path length, provided the electrode width and direction vary slowly compared to the wavelength so that a local approximation may be applied. That is, for an acoustic wave of wavenumber k produced by an applied signal voltage of amplitude $V_0$, the local Lamb wave amplitude $\alpha_{local}(s)^{\pm}$ is expected to vary according to $$\alpha_{local}(s)^{\pm} = \gamma V_0 \sin kL_{local}(s),$$

where γ is a constant of proportionality determined by the film thickness and material properties. Within the limits of the local approximation, a transducer can be tailored to emit a focused Lamb beam by varying the transducer width to follow the Lamb beam amplitude along constant phase contours.

In the Gaussian beam limit, i.e. at large distances from the focus of the beam, the wave will have an on-axis peak amplitude inversely proportional to its waist, and it will decay from its on-axis maxima as $\exp[-\theta^2/\theta_D^2]$. The symbol θ designates angular displacement from the propagation axis, and the symbol $\theta_D$ designates the divergence angle of the beam.

Thus a single finger having an on-axis, local maximum that decays as $\exp[-\theta^2/\theta_D^2]$ will produce a wave that comes to a focus at a relatively distant point that we arbitrarily designate as the origin.

A single curved finger would have an electrical impedance similar to a single straight finger of equal area. Thus a set of curved IDTs is required to achieve reasonable filter quality factors and impedance matching. We specify a set of electrode fingers by placing the first finger (the $0^{th}$ finger) an integer multiple of wavelengths to the left of the origin at a coordinate $-\bar{z}_0$. Additionally, the $0^{th}$ finger will have an on-axis width of $L_0 = \lambda/2$, where λ is the acoustic wavelength. Each successive finger (i.e., for in =1, 2, etc.) will have a center at $\bar{z}_n = -\bar{z}_0 - n\lambda$ and an on-axis width falling inversely with radius to maintain constant electrode area for each finger. Off-axis, all fingers require their local widths to fall off exponentially following the amplitude of the Lamb beam. Thus L $$L_n(\theta) = L_n(0)\exp\left[-\frac{\theta^2}{\theta_D^2}\right],$$

with $$L_n(0) \sim \frac{1}{nL_o(0)}.$$

Additionally, there is a maximum angle, $\theta_D/2$, out to which the fingers are swept which ensures that all of the fingers meet the bus at a straight line.

Furthermore, a focusing transducer can be specified by laying out electrodes as described above, following constant phase contours at integer or half-integer fractions of π and with local widths that follow the local field amplitude as determined from Eq. 1, above. Also, Eq. 2, above, can be used where:

(1) the beam phase θ(z) and radius of curvature R(z) set the finger contours, and (2) the on-axis finger width is proportional to the inverse of beam waist 1/w(z), since the field drops as such and the finger width drops exponentially as $\exp[-s^2/w(z)^2]$.

Finally, a resonator is defined by hard edges at constant phase contours at integer or half-integer fractions of π. One edge is far from the focus for the input electrodes, and the other edge, for the output electrode, is as close to the focus as possible. The output electrode contains the focus. It potentially consists of one finger, to get the highest possible step-up.

Fabrication

In an illustrative example, the fabrication process begins with high resistivity six-inch Si wafers upon which a 0.6 μm oxide and a 4 μm polysilicon release layer are consecutively deposited. The polysilicon is then patterned to define where the AlN membranes will be undercut and suspended from the substrate. The polysilicon in this layer will be selectively removed in later steps, and it therefore constitutes a sacrificial material that ultimately defines regions of air.

Next, an oxide layer is deposited and chemically and mechanically polished squaring up to the sacrificial polysilicon release material. Additionally, in this layer, tungsten plugs are machined into the oxide in order to make contact to the bottom electrode. Ultimately, electrical pads will be connected from above to the tungsten plug through vias. This layer, therefore, constitutes regions of tungsten plugs over which probe tips will ultimately land, and it further constitutes regions of the suspended membrane where polysilicon is defined.

Next, the electrically grounded bottom electrode, formed from 20/20/50 nm of Ti/TiN/Al is deposited and a 0.75 μm layer of AlN is sputter deposited. Vias are then etched in the AlN, landing on the tungsten plugs. After this, a top electrode layer of 70/20 nm of Al/TiN is deposited.

The top electrode layer is then patterned to form the piezo-electric transducers and pads. The release trenches are finally etched to expose the polysilicon release layer and, simultaneously, to create the back reflectors and/or waveguides. The device is suspended from the substrate using a dry release in $XeF_2$.

System

Figure 15:
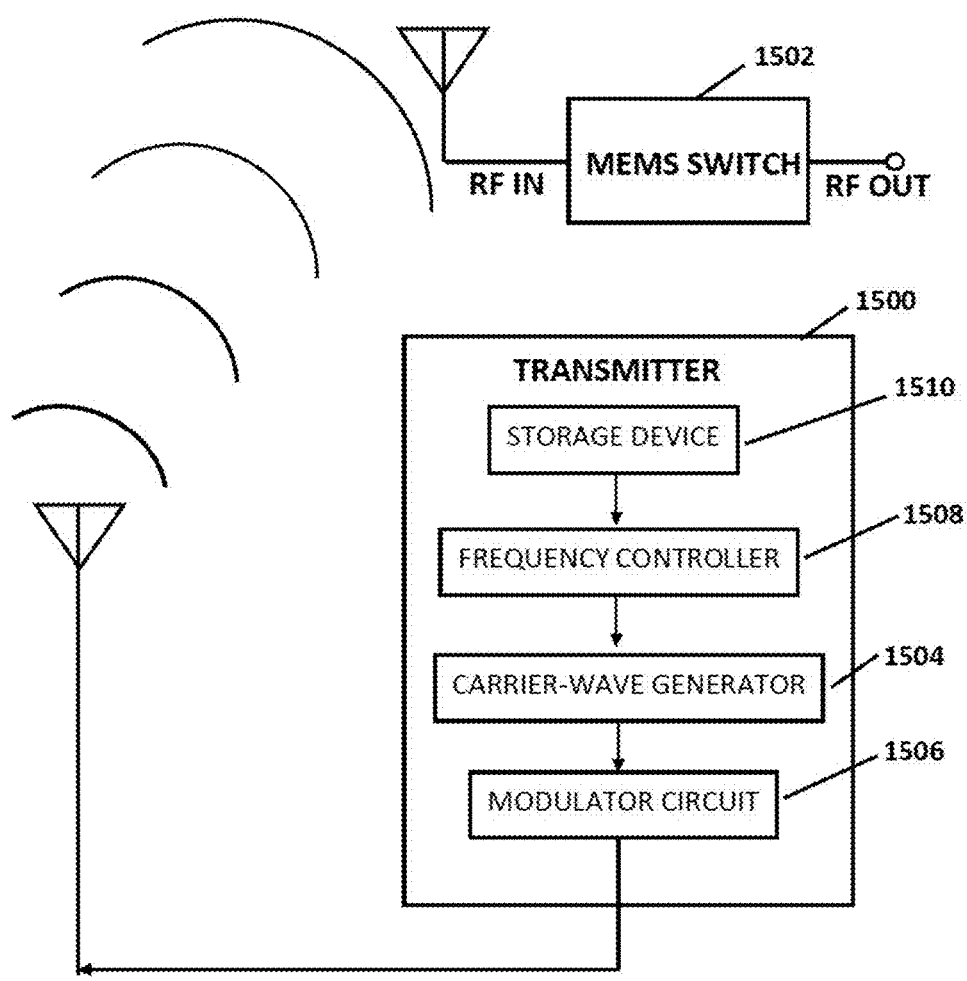
FIG. 15 is a functional block diagram of a system that includes a transmitter and a switch as described herein.

FIG. 15 is a functional block diagram of a system consisting of transmitter 1500 and resonant switch 1502. Within the transmitter, a carrier wave is generated by carrier-wave generator 1504 and is modulated by modulator circuit 1506. The carrier-wave frequency is determined by frequency controller 1508, which may control the carrier-wave frequency in accordance with a chirping pattern stored in storage device 1510.

Figure 16:
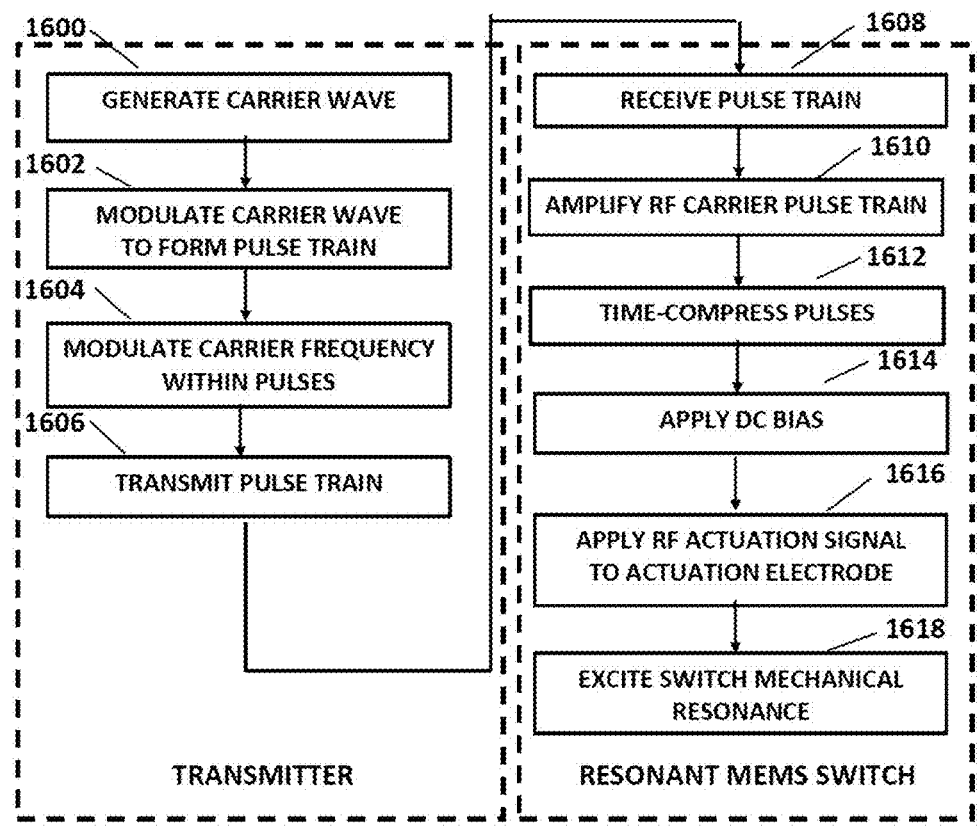
FIG. 16 is a flowchart illustrating an example method for using the system of FIG. 15.

FIG. 16 is a flowchart illustrating an example method for using the system of FIG. 15. In the transmitter, the carrier wave is generated (1600) and modulated (1602) to form a pulse train. The carrier frequency is optionally varied (1604) within each pulse, so as to produce a train of chirped pulses. For example, each pulse may comprise a plurality of pulse segments, each segment containing a single carrier frequency or a range of carrier frequencies. The carrier frequency may be varied such that the pulse segments within each pulse contain different carrier frequencies, for example because the carrier frequency ranges are different.

With further reference to FIG. 16, the pulse train is transmitted (1606) to the resonant MEMS switch, where it is received (1608). The pulse train is amplified (1610) in a passive impedance transforming voltage amplifier, thereby producing an RF actuation signal for application to an RF actuation electrode. The amplification may be in the acoustic domain if, for example, a piezoelectric amplifier is used. The pulses are optionally time-compressed (1612). The time compression may also be performed in the acoustic domain.

With further reference to FIG. 16, a DC bias is applied (1614) to a DC bias electrode positioned to latch a MEMS switch in a closed position by electrostatic attraction when energized by a suitable voltage. The DC bias electrode is distinct from the RF actuation electrode. While applying the DC bias, the RF actuation signal is applied (1616) to the RF actuation electrode of the MEMS switch. The successive pulses in the RF actuation signal excite (1618) a mechanical mode of vibration of the switch until the switch reaches its closed position.

We claim:
1. A radiofrequency device, comprising:
a passive impedance transforming voltage amplifier receivingly connected to an antenna for receiving radiofrequency (RF) signals, the impedance transforming voltage amplifier adapted to produce an RF actuation signal; and
a MEMS switch having a radiofrequency (RF) actuation electrode receivingly connected to the impedance transforming voltage amplifier;
wherein:
the MEMS switch further comprises a DC bias electrode positioned to latch the MEMS switch in a closed position by electrostatic attraction when energized by a suitable voltage;
the MEMS switch further comprises a bridge that physically and electrically contacts at least the DC bias electrode when the MEMS switch is in the closed position; and
the bridge is configured with a mechanical mode of vibration that, when subjected to the RF actuation signal having a fundamental frequency that matches at least one frequency of the said mechanical mode of vibration, allows the MEMS switch to be periodically urged toward the closed position.

2. The radiofrequency device of claim 1, wherein the bridge physically and electrically contacts both the RF actuation electrode and the DC bias electrode when the switch is in the closed position.

3. The radiofrequency device of claim 1, wherein the impedance-transforming voltage amplifier is configured to amplify modulations of RF carrier energy in a modulated signal, the modulated signal having a fundamental frequency that is lower than a carrier wave frequency and that matches at least one frequency of the said mechanical mode of vibration.

4. The radiofrequency device of claim 3, wherein the impedance transforming voltage amplifier is in a dispersive circuit that compresses the modulated RF carrier energy in the received radiofrequency (RF) signals.

5. The radiofrequency device of claim 4, wherein the dispersive circuit comprises a network of acoustic delay elements that compresses the modulations of RF carrier energy in the acoustic domain.

6. The radiofrequency device of claim 3, wherein the fundamental frequency is variable.

7. The radiofrequency device of claim 3, wherein the radiofrequency (RF) signal comprises a carrier wave, the carrier wave having a variable carrier frequency within each modulation.

8. The radiofrequency device of claim 1, wherein the impedance transforming voltage amplifier comprises a resonant voltage transformer.

9. The radiofrequency device of claim 8, wherein the resonant voltage transformer is a piezoelectric focusing transformer.

10. The radiofrequency device of claim 8, wherein the resonant voltage transformer is a piezoelectric voltage transformer, and wherein the piezoelectric voltage transformer is included in a circuit that further comprises a frequency-selective network of acoustic time-delay elements.

11. The radiofrequency device of claim 1 in a system that further comprises a transmitter, wherein:
the transmitter is configured to transmit the radiofrequency (RF) signal, the radiofrequency (RF) signal comprising a carrier wave modulated by an envelope; and
the transmitter comprises a configurable modulator circuit that can modulate the carrier wave with the envelope having a fundamental frequency that is lower than a carrier wave frequency and that matches at least one frequency of the said mechanical mode of vibration.

12. The radiofrequency device of claim 11, wherein:
the transmitter further comprises
   a carrier-wave generator for generating the carrier wave, the carrier wave having a variable frequency,
   a frequency controller, and
   a storage device;
the carrier-wave generator is configured to vary the carrier wave frequency in response to control signals from the frequency controller; and
the frequency controller is configured to retrieve at least one stored pattern of frequency variation from the storage device.

13. The radiofrequency device of claim 11, wherein the fundamental frequency is variable.

14. A method for operating a radiofrequency device, comprising:
in a passive impedance transforming voltage amplifier, amplifying modulations of a radiofrequency (RF) carrier, the modulations having a fundamental frequency, thereby to produce an RF actuation signal;
applying a DC bias to a DC bias electrode positioned to latch a MEMS switch in a closed position by electrostatic attraction when the DC bias electrode is energized by a suitable voltage; and
while applying the DC bias, applying the RF actuation signal to an RF actuation electrode of the MEMS switch;
wherein:
the RF actuation electrode is distinct from the DC bias electrode;
the MEMS switch comprises a bridge that physically and electrically contacts the DC bias electrode when the MEMS switch is in the closed position;
the bridge is configured with a mechanical mode of vibration that, when subjected to the RF actuation signal having the fundamental frequency that matches at least one frequency of the said mechanical mode of vibration, allows the MEMS switch to be periodically urged toward the closed position; and the RF actuation signal is applied such that when the RF actuation signal includes the fundamental frequency that matches at least one frequency of the said mechanical mode of vibration, the RF actuation signal increasingly excites the said mechanical mode of vibration until the MEMS switch reaches the closed position.

15. The method of claim 14, wherein the modulations are amplified in the acoustic domain.

16. The method of claim 15, wherein the modulations are time-compressed in the acoustic domain.

17. The method of claim 16, wherein:
the carrier wave has a frequency that is varied within each of said modulations; and
the time-compression of the modulations comprises dividing each pulse modulation into segments in a frequency-selective manner, subjecting each segment to a respective time delay, and recombining the time-delayed segments.

18. The method of claim 14, further comprising transmitting the modulations of radiofrequency (RF) carrier from a transmitting device to an antenna coupled to the passive impedance transforming voltage amplifier.

19. The method of claim 16, wherein the transmitting device generates the modulations by modulating an RF carrier wave.

20. The method of claim 17, wherein:
the RF carrier wave has a carrier frequency; and
the method further comprises, in the transmitting device, varying the carrier frequency within each modulation.

21. The method of claim 18, wherein the carrier frequency is varied such that each modulation comprises a plurality of modulation segments, and at least two of the modulation segments within each modulation contain different carrier frequencies.

22. The method of claim 19, wherein the fundamental frequency is variable.

23. The method of claim 14, wherein the fundamental frequency is variable.

* * * * *